US007460097B2

(12) United States Patent
Yamagata et al.

(10) Patent No.: US 7,460,097 B2
(45) Date of Patent: Dec. 2, 2008

(54) SEMICONDUCTOR INTEGRATED CIRCUIT FOR DRIVING LIQUID CRYSTAL PANEL

(75) Inventors: Seiji Yamagata, Kawasaki (JP); Masatoshi Kokubun, Kawasaki (JP); Shinya Udo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 815 days.

(21) Appl. No.: 10/930,856

(22) Filed: Sep. 1, 2004

(65) Prior Publication Data

US 2005/0024315 A1 Feb. 3, 2005

Related U.S. Application Data

(62) Division of application No. 09/733,075, filed on Dec. 11, 2000, now Pat. No. 6,864,873.

(30) Foreign Application Priority Data

Apr. 6, 2000 (JP) ............................ 2000-105308
Apr. 6, 2000 (JP) ............................ 2000-105317

(51) Int. Cl.
*G09G 3/36* (2006.01)
*G09G 3/38* (2006.01)
*G09G 5/10* (2006.01)
*G01R 31/00* (2006.01)

(52) U.S. Cl. ......................... 345/89; 345/211; 345/690; 345/904; 324/770

(58) Field of Classification Search ........... 345/55-100, 345/204-214, 690-693
See application file for complete search history.

(56) References Cited

U.S. PATENT DOCUMENTS 5,796,379 A * 8/1998 Enomoto et al. .............. 345/89
5,995,073 A 11/1999 Isami et al.
6,191,779 B1 2/2001 Taguchi et al.
6,304,241 B1 * 10/2001 Udo et al. ..................... 345/96
6,333,730 B1 * 12/2001 Lee ............................ 345/100
6,417,827 B1 * 7/2002 Nagao et al. .................. 345/89
6,441,758 B1 * 8/2002 Koyama et al. ............. 341/136
6,549,196 B1 * 4/2003 Taguchi et al. .............. 345/210
2002/0008684 A1 * 1/2002 Udo et al. ..................... 345/89

FOREIGN PATENT DOCUMENTS

JP 05341735 A 12/1993
JP 06348235 A 12/1994

* cited by examiner

*Primary Examiner*—David L Lewis
(74) *Attorney, Agent, or Firm*—Staas & Halsey LLP

(57) ABSTRACT

Lower level of data latch holding a digital image data and a positive selector arranged immediately above positive gradation voltage line, for selecting positive analog gradation voltage of positive gradation levels are take as a set, and upper level of data latch holding a digital image data and a negative selector arranged immediately above negative gradation voltage line, for selecting negative analog gradation voltage of negative gradation levels are take as a set. Two sets are arranged in alignment in vertical direction. A plurality of sets of vertically aligned sets are arranged horizontally to shorten a length in horizontal direction with respect to gradation voltage lines.

18 Claims, 22 Drawing Sheets

SEMICONDUCTOR INTEGRATED CIRCUIT FOR DRIVING LIQUID CRYSTAL PANEL

CROSS-REFERENCE TO RELATED APPLICATIONS

This application is a divisional application of application Ser. No. 09/733,075, filed Dec. 11, 2000, now U.S. Pat. No. 6,864,873, which claims priority from Japanese Application Numbers 2000-105317 and 2000-105308, both filed Apr. 6, 2000.

BACKGROUND OF THE INVENTION

1. Field of the Invention

The present invention relates generally to a semiconductor integrated circuit for driving a liquid crystal panel. More particularly, the invention relates to a semiconductor integrated circuit for a liquid crystal panel outputting an analog gradation voltage for the liquid crystal display on the basis of a digital image data, a gradation wiring for a display, a driver for the liquid crystal display and a stress test method.

2. Description of the Related Art

FIG. 21 is an illustration of the a construction of conventional liquid crystal display apparatus. The liquid crystal apparatus includes a thin film transistor (TFT) liquid crystal panel PNL and a semiconductor integrated circuit 40 for driving the liquid crystal panel PNL. The semiconductor integrated circuit 40 includes a data latch portion LT, a selector portion SEL, an operational amplifier portion OP and an output switching portion SW. In the data latch portion LT, 2×m in number of data latches LT1 to LT4 are arranged in horizontal direction. In the selector portion SEL, 2×m in number of selectors SELL to SEL4 are arranged in horizontal direction. In the operational amplifier portion OP, 2×m in number of operational amplifiers OP1 to OP4 are arranged in horizontal direction. In the output switching portion SW, a m in number of output switches SW1 and SW2 are arranged in horizontal direction.

In the semiconductor integrated circuit 40, if the number of outputs is 384, for example, the number m becomes 192. It should be noted that, in FIG. 21, reduced number of the components arranged in horizontal direction are illustrated for simplification of illustration.

To the data latch portion LT, data latching lines arranged immediately thereabove are connected via wiring contact portions 1 (shown by black dot ●). Negative data latches LT1 and LT3 and positive data latches LT2 and LT4 are arranged alternately in number of 2×m in horizontal direction. The negative data latches LT1 and LT3 receive and hold externally input a n bit (6 bits in case of 64 level gradation) digital image data for generating a negative analog gradation voltage of a predetermined gradation level. The positive data latches receive and hold externally input n bit digital image data for generating a position analog gradation voltage.

In the selector portion SEL, negative selectors SELL and SEL3 and positive selectors SEL2 and SEL4 are arranged alternatively in number of 2×m in horizontal direction. The negative selectors SEL1 and SEL3 are formed with N-channel MOS transistors, and the positive selectors SEL2 and SEL4 are formed with P-channel MOS transistors. In case of 64 level gradation, for example, 64×2 positive and negative gradation voltage lines LN are arranged immediately above the selectors SEL1 to SEL4. To the negative selectors SEL1 and SEL3, 64 negative gradation voltage lines LN are connected via the wiring contact portions 1, and to the positive selectors SEL2 and SEL4, 64 positive gradation voltage lines LN are connected via the wiring contact portions 1.

The negative selectors SEL1 and SEL3 select the negative analog gradation voltage of a given gradation level depending upon the digital image data held by the data latches LT1 and LT3 on the basis of the negative analog gradation voltage in a range from 6V to 0V generated on the negative gradation voltage lines LN, for example. The positive selectors SEL2 and SEL4 select the positive analog gradation voltage of a given gradation level depending upon the digital image data held by the data latches LT1 and LT3 on the basis of the positive analog gradation voltage in a range from 6V to 12V generated on the positive gradation voltage lines LN, for example.

In the operational amplifier portion OP, negative operational amplifiers OP1 and OP3 and position operational amplifiers OP2 and OP4 are arranged alternately in number of 2×m in horizontal direction. The negative operational amplifiers OP1 and OP3 amplify and output the negative analog gradation voltages selected by the negative selectors SEL1 and SEL3. The positive operational amplifiers OP2 and OP4 amplify and output the positive analog gradation voltages selected by the positive selectors SEL2 and SEL4.

In the output switch portion SW, the output switches SW1 and SW2 are arranged in number of m in horizontal direction. The output switch SW1 switches and outputs either the negative analog gradation voltage output from the negative operational amplifier OP1 and the positive analog gradation voltage output from the positive operational amplifier OP2 by switching a signal path between straight and cross, to the liquid crystal panel PNL. The output switch SW2 switches and outputs either the negative analog gradation voltage output from the negative operational amplifier OP3 and the positive analog gradation voltage output from the positive operational amplifier OP4 by switching a signal path between straight and cross, to the liquid crystal panel PNL. The liquid crystal panel PNL is driven each pixel of three colors of red, blue and green by predetermined gradation voltages for respective colors for liquid crystal display.

The semiconductor integrated circuit 40 is formed into a rectangular shape having greater length 24 in horizontal direction since 2×m sets (e.g. 384 sets) of columns, in which the data latch portion LT, the selector portion SEL and the operational amplifier portion OP are aligned vertically, are aligned in horizontal direction. For example, the length 24 in horizontal direction is approximately 15 mm and a length in vertical direction is approximately 2 mm. Since this semiconductor integrated circuit 40 has relative large area, development of the semiconductor integrated circuit 40 having smaller area has been demanded. Particularly, shortening of the horizontal length of the semiconductor integrated circuit 40 is strongly demanded.

On the other hand, in the portion immediately above the negative selectors SELL and SEL3, while the negative gradation voltage lines LN are connected to the negative selectors SELL and SEL3 via the wiring contact portions 1, the positive gradation voltage lines LN are not connected to the negative selectors SELL and SEL3 to wastefully leave the region where the positive gradation voltage lines are arranged (hatched region in the drawing) as non-use regions 2. Similarly, in the portion immediately above the positive selectors SEL2 and SEL4, wasteful non-use regions 2 are left.

On the other hand, since the negative selectors SELL and SEL3 formed with N-channel MOS transistors and the positive selectors SEL2 and SEL4 formed with P-channel MOS transistors are arranged alternately, it is required to provide a certain distance 23 between the selectors of mutually different channel type. This inherently require the longer length 24 of the semiconductor integrated circuit 40 in horizontal direction than necessary.

FIG. 22 is a wire diagram of a gradation voltage generating portion in a driver for the liquid crystal display in the prior art. The gradation voltage generating portion has reference voltage input terminals (IC pads) V1 to V9, a ladder resistor R and a gradation wiring WW. The gradation wiring WW can be divided into a front half gradation wiring WA and a rear half gradation wiring WB.

The gradation wiring WW includes sixty-four gradation wiring corresponding to sixty-four gradation levels for example, in practice. However, the following discussion will be given for the case where 33 gradation wiring W1 to W33 are present for simplification of illustration. Between respective gradation wiring of the gradation wiring W1 to W33, ladder resistors R are connected. The input terminal V1 is connected to the gradation wiring W1. The input terminal V2 is connected to the gradation wiring W5. The input terminal V3 is connected to the gradation wiring W9. The input terminal V4 is connected to the gradation wiring W13. The input terminal V5 is connected to the gradation wiring W17. The input terminal V6 is connected to the gradation wiring W21. The input terminal V7 is connected to the gradation wiring W25. The input terminal V8 is connected to the gradation wiring W29. The input terminal V9 is connected to the gradation wiring W33.

The gradation wiring W1 to W33 are connected to the not shown liquid crystal panel PNL for driving the latter with the gradation voltages supplied therefrom. Discussion will be given for a driving method of the liquid crystal panel PNL. It is assumed that 0V is applied to the input terminal V1 and 6V is applied to the input terminal V9. On the other hand, to the input terminals V2 to V8, a voltage interpolating between 0V to 6V are applied. Then, voltages generated in the gradation wiring W1 to W33 are divided by respective ladder resistors R. By this, voltages between 0V to 6V, for which γcorrection is operation and effected, are output from the gradation wiring W1 to W33 are output. Then, by applying the one of the voltage selected among the gradation wiring W1 to W33 depending upon the image data, to the liquid crystal panel PNL, the liquid crystal can be driven.

Each individual gradation wiring in the gradation wiring W1 to W33 is connected to the gradation wiring via the ladder resistor R. It is possible that a foreign matter (dust) penetrates between individual gradation wiring in a fabrication process of the driver for the liquid crystal display. When the foreign matter penetrates between individual gradation wiring, shorting between the between individual gradation wiring can be caused to make if impossible to output the normal gradation voltage from the gradation wiring W1 to W33. If complete shorting is caused between the between individual gradation wiring, it can be easily found as faulty product of the driver for the liquid crystal display in an inspection process.

However, even when the foreign matter penetrates between the between individual gradation wiring, it is possible not to cause complete shorting between the between individual gradation wiring. In such case, it becomes difficult to find failure in the inspection process to possibly ship the faulty product of the driver for the liquid crystal display. In such case, the condition of the foreign matter between the between individual gradation wiring can be varied while used by the user to cause difficulty in outputting the normal gradation voltage for occurrence of failure. If the normal gradation voltage is not output, line defect can be caused in pixel display on the liquid crystal panel PNL.

In order to avoid such program, a stress test has been performed upon inspection of the driver for the liquid crystal display. In the stress test, at first, a stress voltage application process is performed, and subsequently, the inspection process is performed.

Discussion will be given for the stress voltage application process. In the stress voltage application process, at first, a 12V stress voltage (maximum rated voltage), for example, is applied between the input terminals V1 and V2. The 12V stress voltage is also applied between the input terminals V2 and V3, for example. Similarly, between the terminals of the input terminals V3 to V9, the stress voltage is applied, respectively. For example, foreign matter is present between the between individual gradation wiring, insulation failure between the between individual gradation wiring elicits by application of the stress voltage.

After application of the stress voltage, the inspection process is performed. In the inspection process, similarly to normal driving of the liquid crystal panel PNL, 0V is applied to the input terminal V1, for example, and 6V is applied to the input terminal V9, for example, and voltages between 0 to 6V are applied to the input terminals V2 to V8. Then, output voltages of each individual gradation wiring W1 to W33 is measured. If the output voltage thus measured does not fall within a range of predetermined values, the driver for the liquid crystal display is rejected as the faulty product.

However, in the foregoing stress voltage application process, since 12V of the stress voltage is applied between the gradation wiring W1 and W5, low voltage in the extent of about 3V (=12V÷4) is only applied between the gradation wiring W1 and adjacent gradation wiring W2. Namely, it has not been possible to apply sufficiently high stress voltage between the individual gradation wiring. As a result, detection ratio of the insulation failure between the gradation wiring has been relatively low.

On the other hand, in the stress voltage application process, at first, the stress voltage is applied between the input terminals V1 and V2. Then, the stress voltage is applied between the input terminals V2 and V3. Similarly, the stress voltage is applied between the input terminals V3 to V9 sequentially. Therefore, the voltage application process has to be repeated for eight times to take long period in the stress voltage application process.

SUMMARY OF THE INVENTION

It is an object of the present invention to form a semiconductor integrated circuit for driving a liquid crystal panel PNL in a small area.

Another object of the present invention is to provide a gradation wiring for a display, a driver for a liquid crystal display and a stress test method which can certainly detect insulation failure between the gradation wiring.

A further object of the present invention is to provide a gradation wiring for a display, a driver for a liquid crystal display and a stress test method which can detect the insulation failure between the gradation wiring in a short period.

A semiconductor integrated circuit for driving a liquid crystal panel PNL, according to the present invention, comprises data latches holding a n bit digital image data input externally, and selectors arranged immediately thereabove gradation voltage lines on which analog gradation voltages of respective gradation levels are arranged, and selecting one of analog gradation voltages depending upon the n bit digital image data held by the data latches, selectors arranged only gradation voltage lines of the same polarity being arranged immediately thereabove being take as sets, a set of positive polarity and a set of negative polarity being arranged in vertical direction with respect to the gradation voltage lines.

Since the present invention is constructed with the foregoing technical means, the gradation voltage lines to be arranged immediately above the selector can be only those of the same polarity to eliminate non-used region of the selector. Also, since it is not required to alternately arrange the selectors of different types, the same type of transistors can be arranged in a bulk to reduce distance between the elements.

Thus, the length in the horizontal direction with respect to the gradation voltage line can be shortened significantly. As a whole, the area of the semiconductor integrated circuit for driving the liquid crystal panel PNL can be reduced.

A gradation wiring for a display, according to the present invention, comprises wiring for respective gradation levels of a first gradation level range for outputting voltage of the first gradation level range when total number of gradation levels of the display is divided into a plurality of fractions, and wiring for respective gradation level of a second gradation level range different from the first gradation level range, for outputting voltage of the second gradation level range and being arranged alternately with the wiring of respective gradation level of the first gradation level range. Then, upon performing inspection of the insulation failure or the like of the gradation wiring, a first potential is applied to the predetermined wiring of the first gradation level range and a second potential is applied to the predetermined wiring of the second gradation level range to apply the stress voltage higher than the reference input voltage between respective wiring.

Since the present invention is constructed with the foregoing technical means, the same potential (first potential) is applied for respective wiring of the first gradation level range and the same potential (second potential different from that applied to the first gradation level range) is applied for respective wiring of the second gradation level range arranged alternately with respective wiring of the first gradation level range to apply a differential voltage of the first potential and the second potential can be applied between respective wiring of the first gradation level range and adjacent wiring of the second gradation level range. By this, by applying the first potential and the second potential at once, large stress voltage can be applied between respective gradation wiring.

By applying the sufficiently large stress voltage between respective gradation wiring, the insulation failure between the gradation wiring can be detected certainly. On the other hand, since the stress voltage can be applied between respective gradation wiring in one time of stress voltage application process, insulation failure between the gradation wiring can be detected within a short period.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DETAILED DESCRIPTION OF THE PREFERRED EMBODIMENTS

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

First Embodiment

Figure 1:
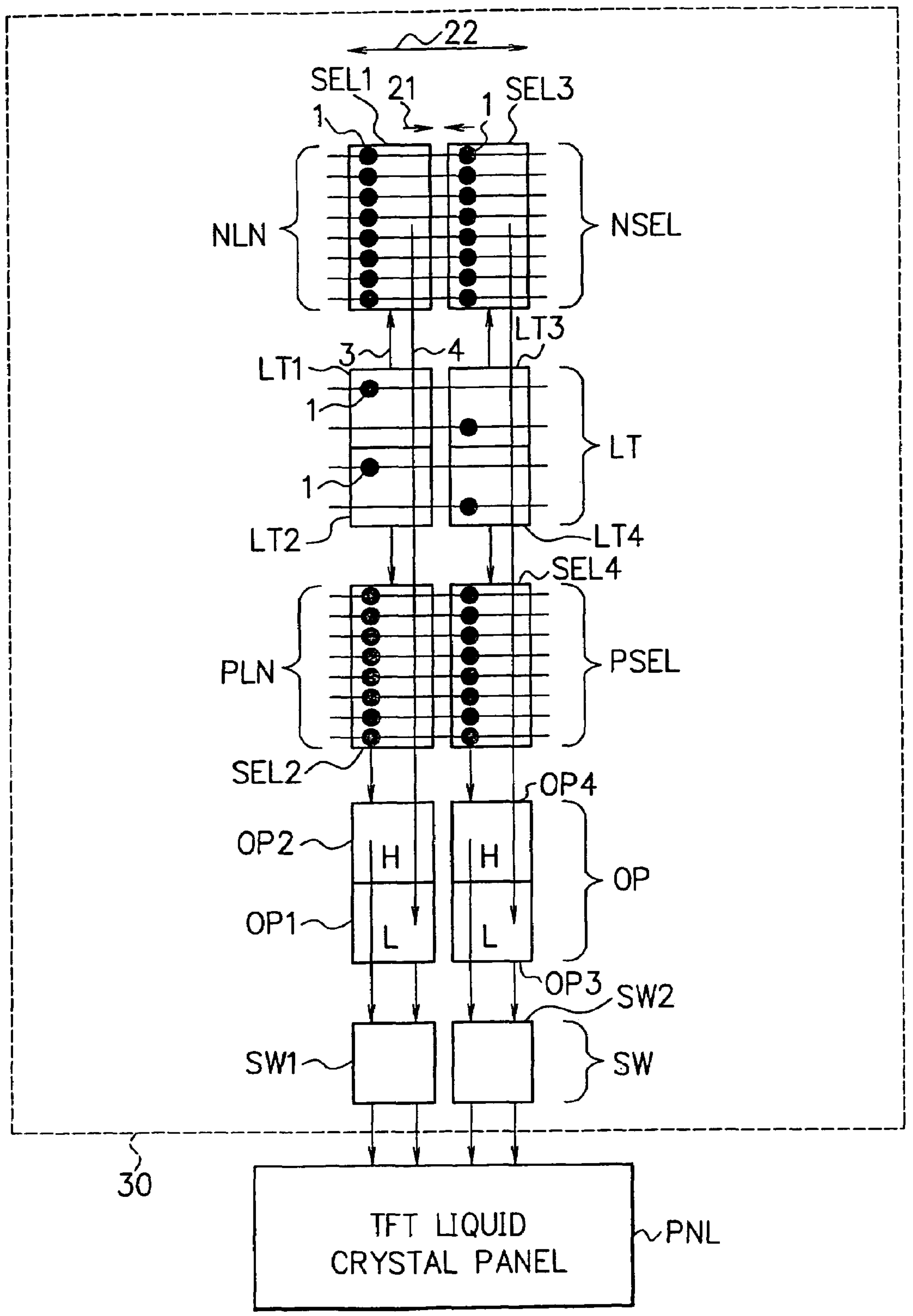
FIG. 1 is an illustration showing a construction of the first embodiment of a liquid crystal display apparatus according to the present invention.
Figure 21:
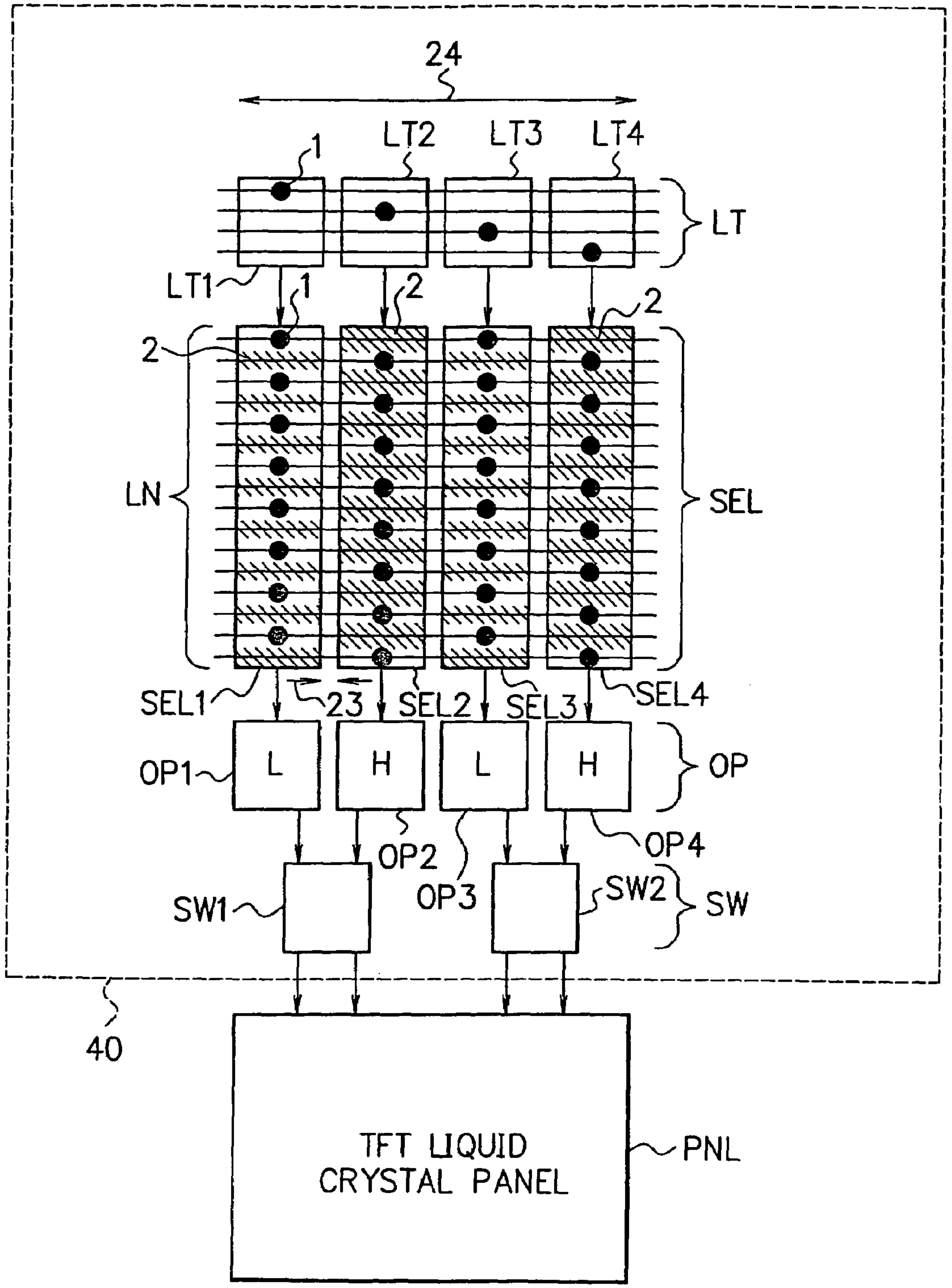
F I G. 21 PRIOR ART
FIG. 21 is an illustration showing an example of construction of the conventional liquid crystal display apparatus.

FIG. 1 is an illustration showing a construction of the first embodiment of a liquid crystal display apparatus according to the present invention. The liquid crystal display apparatus has as TFT liquid crystal panel PNL and a semiconductor integrated circuit 30 for driving the liquid crystal panel PNL. The semiconductor integrated circuit 30 includes a negative selector Portion (N-channel selector position) NSEL, a data latch portion LT, a positive selector portion (P-channel selector portion) PSEL, an operational amplifier portion OP and an output switching portion SW. In the shown embodiment of FIG. 1, the selector portion SEL in FIG. 21 is divided into the negative selector portion NSEL and the positive selector portion PSEL. On the other hand, TFT liquid crystal panel PNL is the same as that in FIG. 21.

In the data latch portion LT, a data latching line arranged immediately thereabove is connected via a wiring contact portion 1 (shown by black dot ●). In the data latch portion LT, m in number of negative data latches LT1 and LT3 are arranged in horizontal direction in upper level and m in number of positive data latches LT2 and LT4 are arranged in horizontal direction in lower level. The negative data latches LT1 and LT3 receive and hold n-bit (6 bits in case of sixty-four gradation levels) external digital image data for generating negative analog gradation voltages of a given gradation level. The positive data latches LT2 and LT4 receive and hold n-bit external digital image data for generating positive analog gradation voltages of a given gradation level.

The negative selector portion NSEL is constructed with N-channel MOS transistors (transfer gates), in which m in number of negative selectors SELL and SEL3 are arranged in horizontal direction. Immediately above the negative selectors SEL1 and SEL3, m/3 in number (e.g., 64 in number) of negative gradation voltage lines NLN extending in horizontal direction are arranged in vertical direction in parallel relationship with each other. To the negative selectors SEL1 and SEL3, the m/3 negative gradation voltage lines NLN are connected via the wiring contact portions 1.

The negative selectors SEL1 and SEL 3 select the negative analog gradation voltage indicative of the given gradation levels depending upon the digital image data from the negative data latches LT1 and LT3 via signal lines 3 on the basis of negative analog gradation voltage in a range from 6V to 0V, for example, generated on the negative gradation voltage lines NLN, for supplying to the operational amplifier portion OP via a signal line 4.

Figure 2:
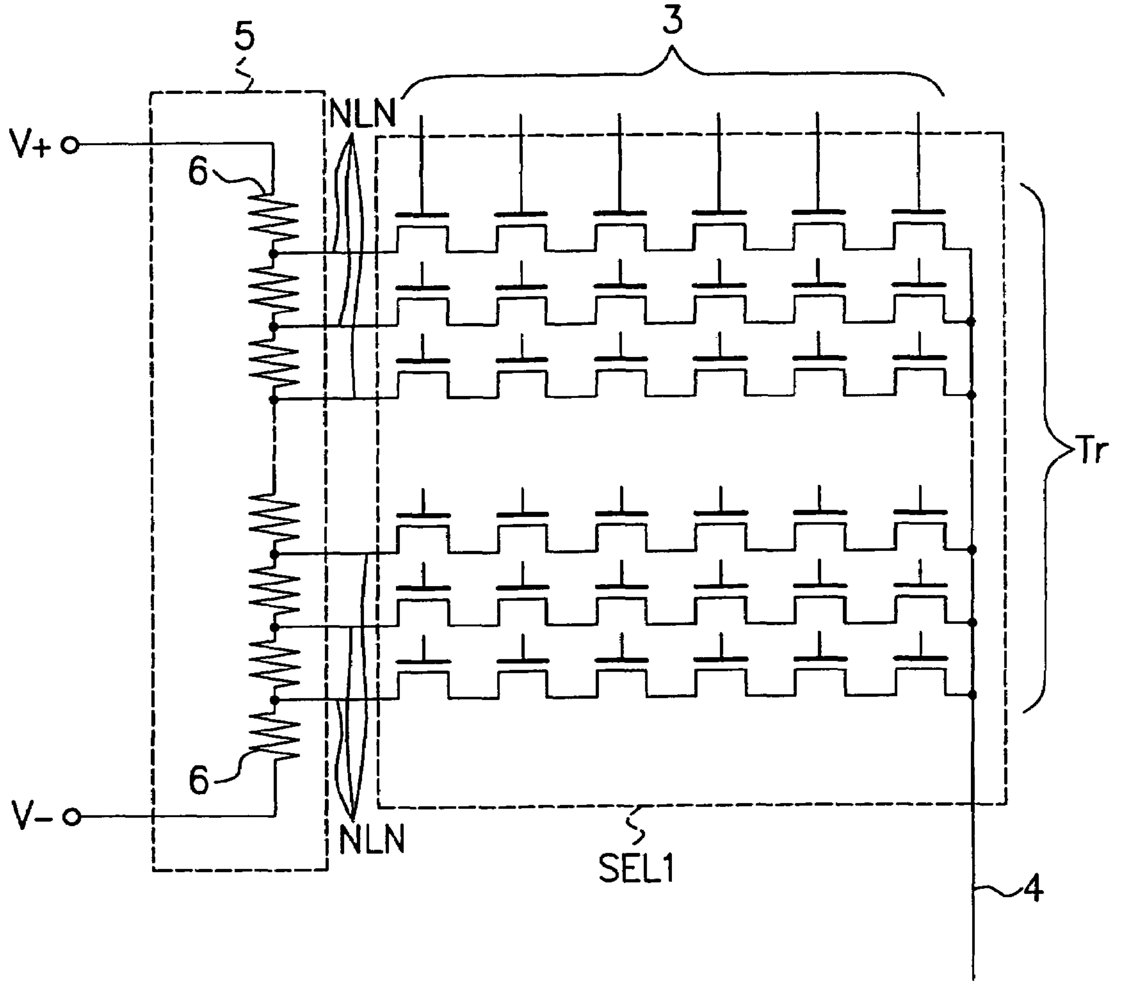
FIG. 2 is a circuit diagram showing an embodiment of a gradation voltage generating portion and a selector.

FIG. 2 is a circuit diagram of the negative selector NSEL (N-channel selector) SEL1 and the gradation voltage generating portion 5 connected to the former. To a terminal V+of the gradation voltage generating portion 5 is applied 6V, for example, and to a terminal V−, 0V is applied, for example. Between the terminal V+ and V−, a ladder resistor 6 is connected. For dividing the resistors in the ladder resistor 6, m/3 (for example, sixty-four) negative gradation voltage lines NLN are connected to the ladder resistor 6. For example, between 6V to 0V, negative analog gradation voltages of sixty-four gradation levels are generated.

In case of sixty-four (6 bits) gradation levels, six N-channel MOS transistors (transfer gates) Tr are connected to respective negative gradation voltage lines NLN in series. The N-channel MOS transistors Tr are arranged as a two-dimensional matrix of 6 rows×64 columns. To the gates of each transistor Tr, a signal line 3 from the negative data latch LT1 (FIG. 1) is connected. Depending upon a digital image data supplied to the signal line 3, one of sixty-four negative gradation voltage lines NLN is selected to be output an analog gradation voltage to the negative operational amplifier OP1 (FIG. 1) via the signal line 4. The construction of the negative selector NSEL SEL3 is similar to the construction of the negative selector NSEL SELL.

Returning to FIG. 1, the positive selector portion PSEL is constructed with a P-channel MOS transistor (transfer gate). Further, m in number of the positive selectors SEL2 and SEL4 are arranged in horizontal direction. Immediately above the positive selectors SEL2 and SEL4, m/3 (e.g. sixty-four) positive gradation voltage lines PLN are arranged in vertical direction to extend in horizontal direction. To the positive selectors SEL2 and SEL4, m/3 of positive gradation voltage lines PLN are connected at the wiring contact portions 1.

The positive selectors SEL2 and SEL4 select the positive analog gradation voltage indicative of the predetermined gradation level depending upon the digital image data held by the positive data latches LT2 and LT4. The positive selectors SEL2 and SEL4 and the gradation voltage generating portion connected to the former are similar to those of FIG. 2. However, the transistor Tr is P-channel instead of N-channel. To the terminal V−, 6V is applied and 12V is applied to the terminal V+. In this case, the gradation voltage generating portion 5 generates the positive gradation voltage in the range of 6V to 12V.

In the operational amplifier portion OP, m in number of positive (high level side) operational amplifiers OP2 and OP4 are arranged in horizontal direction at an upper level and m in number of negative (low level side) operational amplifiers OP1 and OP3 are arranged in horizontal direction adjacent the positive operational amplifiers OP2 and OP4. The negative operational amplifiers OP1 and OP3 output the negative analog gradation voltages selected by the negative selectors SEL1 and SEL3 after amplification. The positive operational amplifiers OP2 and OP4 output the positive analog gradation voltages selected by the positive selectors SEL2 and SEL4 after amplification.

In the output switching portion SW, m in number of output switches SW1 and SW2 are arranged in horizontal direction. The output switch SW1 switches either the negative analog gradation voltage output from the negative operational amplifier OP1 or the positive analog gradation voltage output from the positive operational amplifier OP2 by switching a signal path between straight and cross, for outputting to the liquid crystal panel PNL. The output switch SW2 switches either the negative analog gradation voltage output from the negative operational amplifier OP3 or the positive analog gradation voltage output from the positive operational amplifier OP4 by switching a signal path between straight and cross, for outputting to the liquid crystal panel PNL. The liquid crystal panel PNL is driven, for each pixel of three colors of red, blue and green by predetermined gradation voltages for respective colors for liquid crystal display.

In the shown embodiment, the positive selectors SEL2 and SEL4 and the positive data latches LT2 and LT4 are taken as a positive set and the negative selectors SELL and SEL3 and the negative data latches LT1 and LT3 are taken as a negative set. The positive set and the negative set are arranged in alignment in such a manner that the positive data latches LT2 and LT4 and the negative data latches LT1 and LT3 are located adjacent to the positive gradation voltage lines PLN and the negative gradation voltage lines NLN in vertical direction. Then, with taking the structure arranged in vertical alignment as one set, a plurality of sets are arranged in horizontal direction with respect to the positive gradation voltage lines PLN and the negative gradation voltage lines NLN.

By this, in the semiconductor integrated circuit 30, m sets (e.g. 192 sets), each consisted of the negative selector portion NSEL, the data latch portion LT, the positive selector portion PSEL and the operational amplifier portion OP arranged in vertical alignment, are repeated in horizontal direction. As set forth above, in the semiconductor integrated circuit 40 shown in FIG. 21, 2×m sets (e.g. 384) are arranged in horizontal direction, the shown embodiment of the semiconductor integrated circuits 30 are arranged in m sets (e.g. 193 sets) in horizontal direction. Thus, the length 22 in the horizontal direction in the shown embodiment becomes half of the length 24 in horizontal direction in FIG. 21 to make area of the semiconductor integrated circuit 30 smaller. It should be noted that the length of the semiconductor integrated circuit 30 in vertical direction is held substantially unchanged.

On the other hand, in the semiconductor integrated circuit 40 of FIG. 21, the non-used region (hatched region in the drawing) 2 where the gradation voltage line LN arranged immediately above the selector portion SEL is not connected to the selector portion SEL, is formed. In contrast to this, in the shown embodiment of the semiconductor integrated circuit 30, such non-used region is not formed to permit efficiently perform layout of the wiring of the negative selector portion NSEL and the position selector portion PSEL to make the area of the semiconductor integrated circuit 30 as a whole smaller.

On the other hand, in the semiconductor integrated circuit 40 of FIG. 21, a sufficiently large distance 23 has to be provided between the selectors SEL of different channel types. In contrast to this, in the shown embodiment, the negative selectors SELL and SEL3 employ N-channel type transistors, a distance 21 between the selectors SELL and SEL3 can be short. Similarly, the positive selectors SEL2 and SEL4 employ P-channel type transistors, a distance between the selectors SEL2 and SEL4 can be short. Therefore, the area of the semiconductor integrated circuit can be made further smaller.

Second Embodiment

Figure 3:
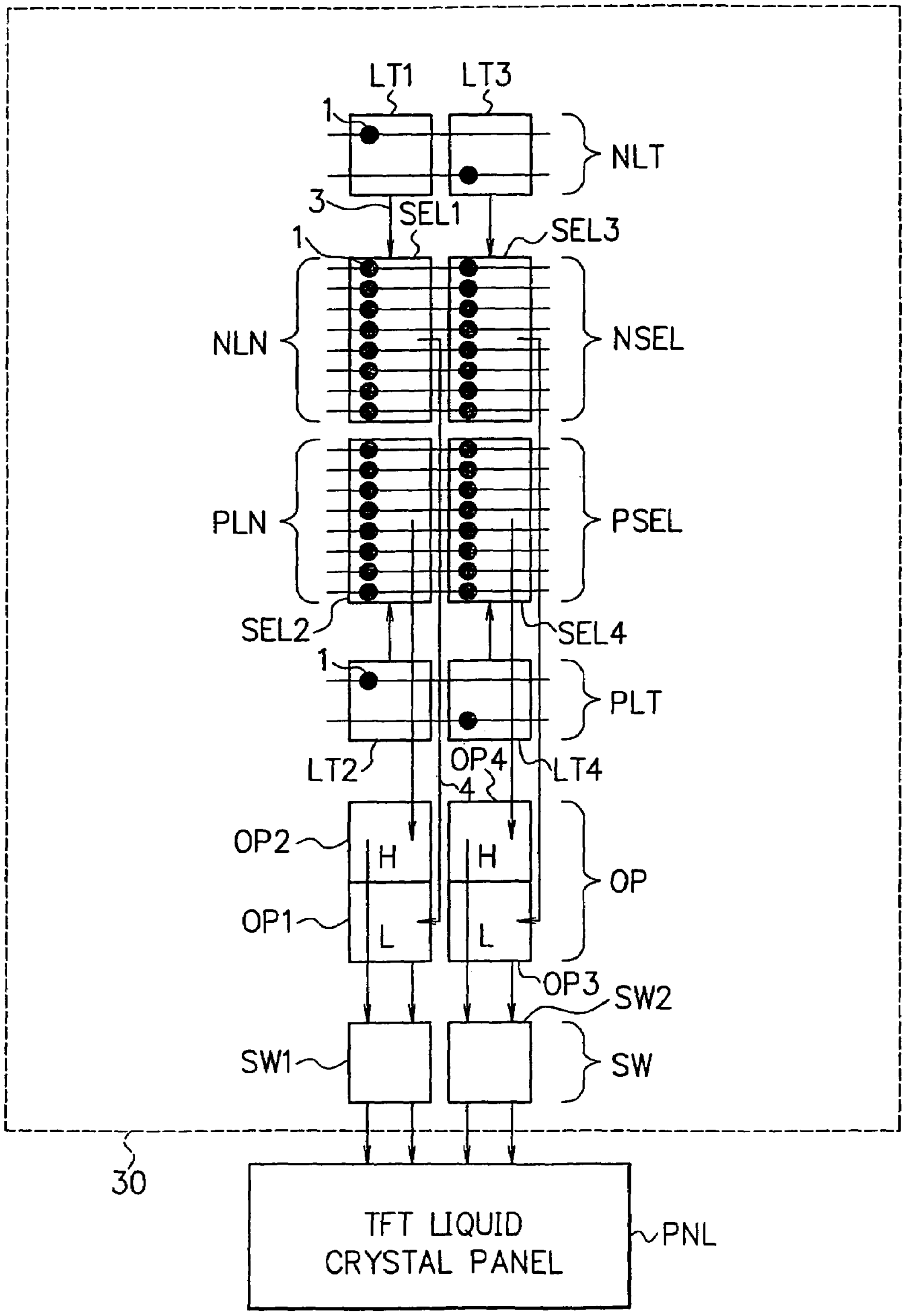
FIG. 3 is an illustration showing a construction of the second embodiment of a liquid crystal display apparatus according to the present invention.

FIG. 3 is an illustration showing a construction of the second embodiment of the liquid crystal display apparatus according to the present invention. The liquid crystal display apparatus has the TFT liquid crystal panel PNL and the semiconductor integrated circuit 30 for driving the liquid crystal pane; In the shown embodiment, in comparison with the first embodiment (FIG. 1), vertical relationship between the negative selector portion NSEL and the upper level of the data latch portion LT is reversed and vertical relationship between the positive selector portion PSEL and the lower level of the data latch portion LT is reversed.

In the shown embodiment of the semiconductor integrated circuit 30, the negative data latch portion NLT, the negative selector portion NSEL, the positive selector portion PSEL and the positive data latch portion PLT, the operational amplifier portion OP and the output switching portion SW are arranged in sequentially order in vertical direction. In the negative data latch portion NLT, m in number of the negative data latches LT1 and LT3 are arranged in horizontal direction, and in the positive data latch portion PLT, m in number of positive data latches LT2 and LT4 are arranged in horizontal direction.

In the shown embodiment, the positive selector PSEL and the positive data latch PLT are taken as a positive set, and the negative selector NSEL and the negative data latch NLT are taken as a negative set. The positive set and the negative set are arranged in alignment in such a manner that the positive selector PSEL and the negative selector NSEL are located adjacent the gradation voltage lines NLN and PLN in vertical direction. Then, the vertically alignment components are taken as one set. A plurality of sets of the vertically aligned components are arranged in horizontal direction with respect to the position gradation voltage lines PLN and the negative gradation voltage lines NLN. This construction is only differentiated in arrangement in relation to the first embodiment (FIG. 1), to achieve the comparable operation and operation and effect to that of the first embodiment set forth above.

Third Embodiment

Figure 4:
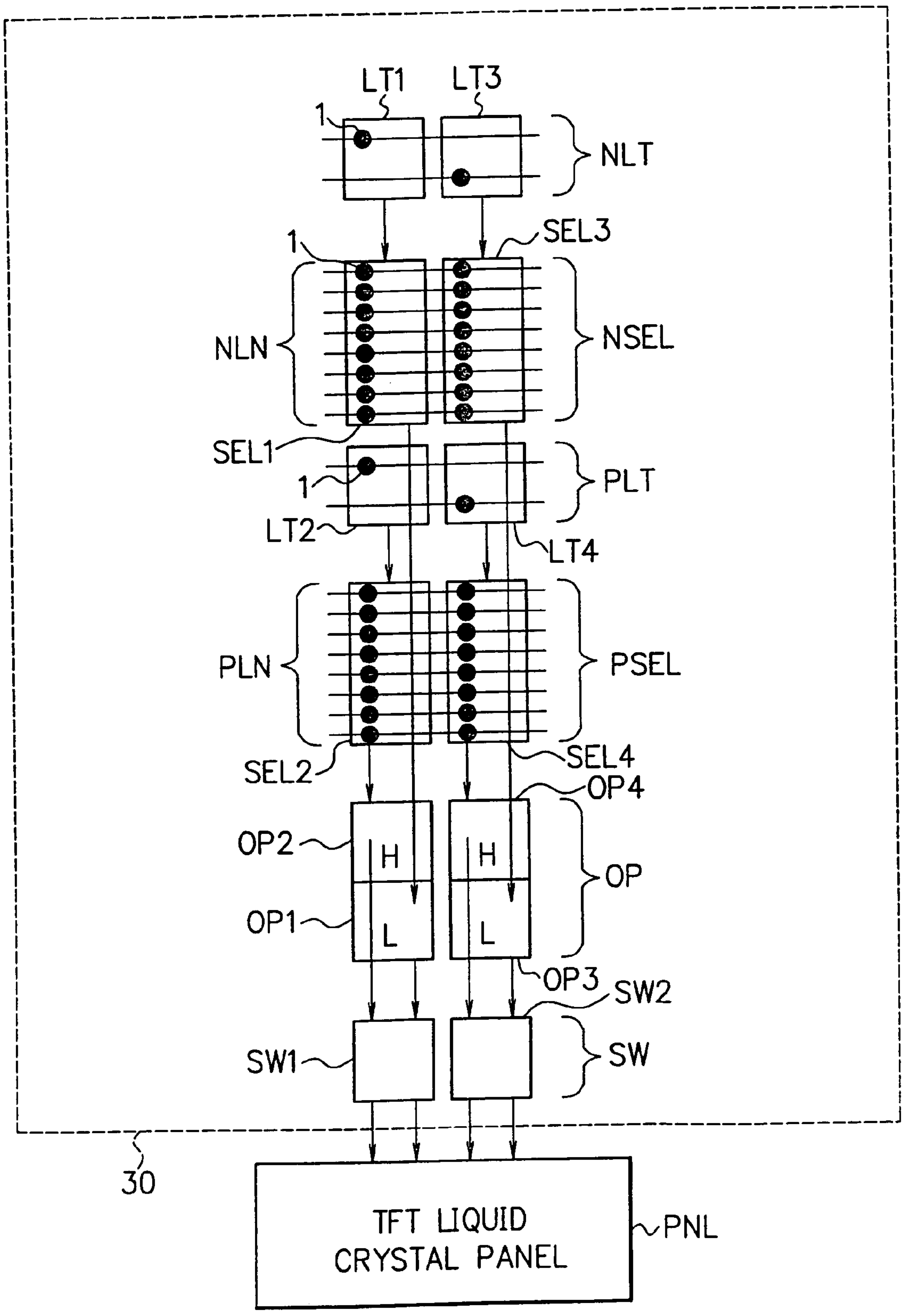
FIG. 4 is an illustration showing a construction of the third embodiment of a liquid crystal display apparatus according to the present invention.

FIG. 4 is an illustration showing a construction of the third embodiment of the liquid crystal display apparatus according to the present invention. The liquid crystal display apparatus has the TFT liquid crystal panel PNL and the semiconductor integrated circuit 30 for driving the liquid crystal panel PNL. In the shown embodiment, in comparison with the second embodiment (FIG. 3), the vertical position of the positive selector portion PSEL and the positive data latch portion PLT is reversed.

In the shown embodiment of the semiconductor integrated circuit 30, the negative data latch portion NLT, the negative selector portion NSEL, the position data latch portion PLT and the positive selector portion PSEL, the operational amplifier portion OP and the output switching portion SW are arranged vertical in the sequential order.

In the shown embodiment, the positive selector PSEL and the positive data latch PLT are taken as positive set, and the negative selector NSEL and the negative data latch NLT are take as negative set. The positive set and the negative set are arranged in alignment in such a manner that the selectors SELL and SEL 3 and the data latches LT2 and LT4 of mutually different negative and positive sets are located adjacent with each other. Then, the vertically alignment components are taken as one set. A plurality of sets of the vertically aligned components are arranged in horizontal direction with respect to the position gradation voltage line PLN and the negative gradation voltage line NLN. This construction is only differentiated in arrangement in relation to the first embodiment (FIG. 1), to achieve the comparable operation and effect to that of the first embodiment set forth above.

Fourth Embodiment

Figure 5:
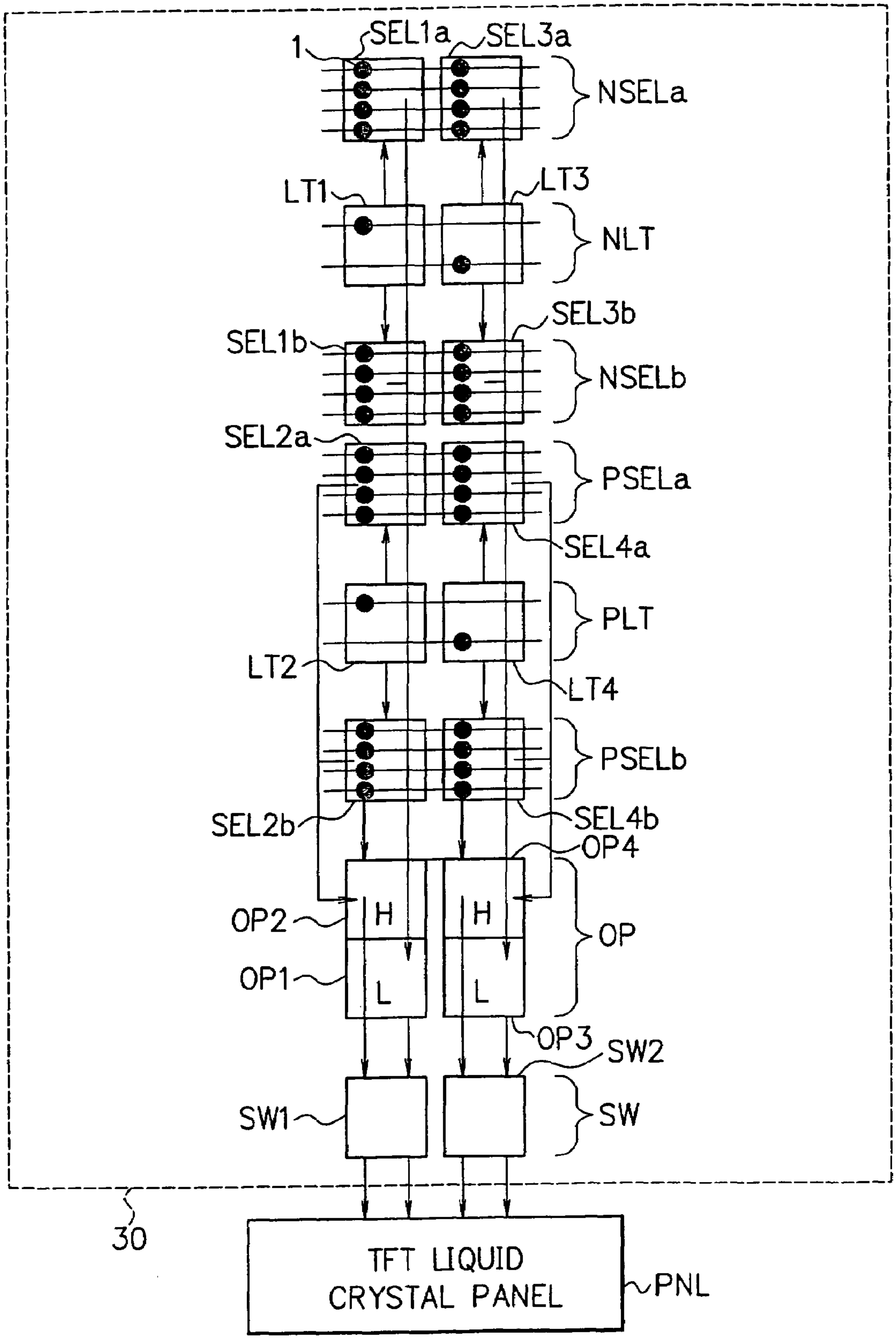
FIG. 5 is an illustration showing a construction of the fourth embodiment of a liquid crystal display apparatus according to the present invention.

FIG. 5 is an illustration showing a construction of the fourth embodiment of the liquid crystal display apparatus according to the present invention. The liquid crystal display apparatus has the TFT liquid crystal panel PNL and the semiconductor integrated circuit 30 for driving the liquid crystal panel PNL. The shown embodiment is differentiated from the second embodiment (FIG. 3) in that the negative selector portion NSEL is divided into a first negative selector portion NSELa and a second negative selector portion NSELb, and the positive selector portion PSEL is divided into a first negative selector portion PSELa and a second positive selector portion PSELb. Division of the selector is performed by dividing the gradation value into half, for example.

In the shown embodiment of the semiconductor integrated circuit 30, the first negative selector portion NSELa, the negative data latch portion NLT, the second negative selector portion NSELb, the first positive selector portion PSELa, the positive data latch portion PLT, the second positive selector portion PSELb, the operational amplifier portion OP and the output switching portion SW are aligned in vertical direction in sequential order. The first negative selector portion NSELa and the second negative selector portion NSELb are arranged in vertical direction interposing the negative data latch portion NLT. The first positive selector portion PSELa and the second positive selector portion PSELb are arranged in vertical direction interposing the positive data latch PLT.

In the shown embodiment, the first and second positive selector portions PSELa and PSELb interposing the positive data latch PLT as the positive set, and the first and second negative selector portions NSELa and NSELb interposing the negative data latch NLT as the negative set. The positive set and the negative set are aligned in vertical direction. The components arranged in vertical alignment is take as one set. A plurality of sets of the vertically aligned components are arranged horizontally with respect to the positive gradation voltage lines PLN and the negative gradation voltage lines NLN. At this time, the positive set and the negative set are arranged so that the second negative selector portion NSELb and the first positive selector portion PSELa are located adjacent with each other in vertical direction. This construction is only differentiated in arrangement in relation to the first embodiment (FIG. 1), to achieve the comparable operation and effect to that of the first embodiment set forth above.

Fifth Embodiment

Figure 6:
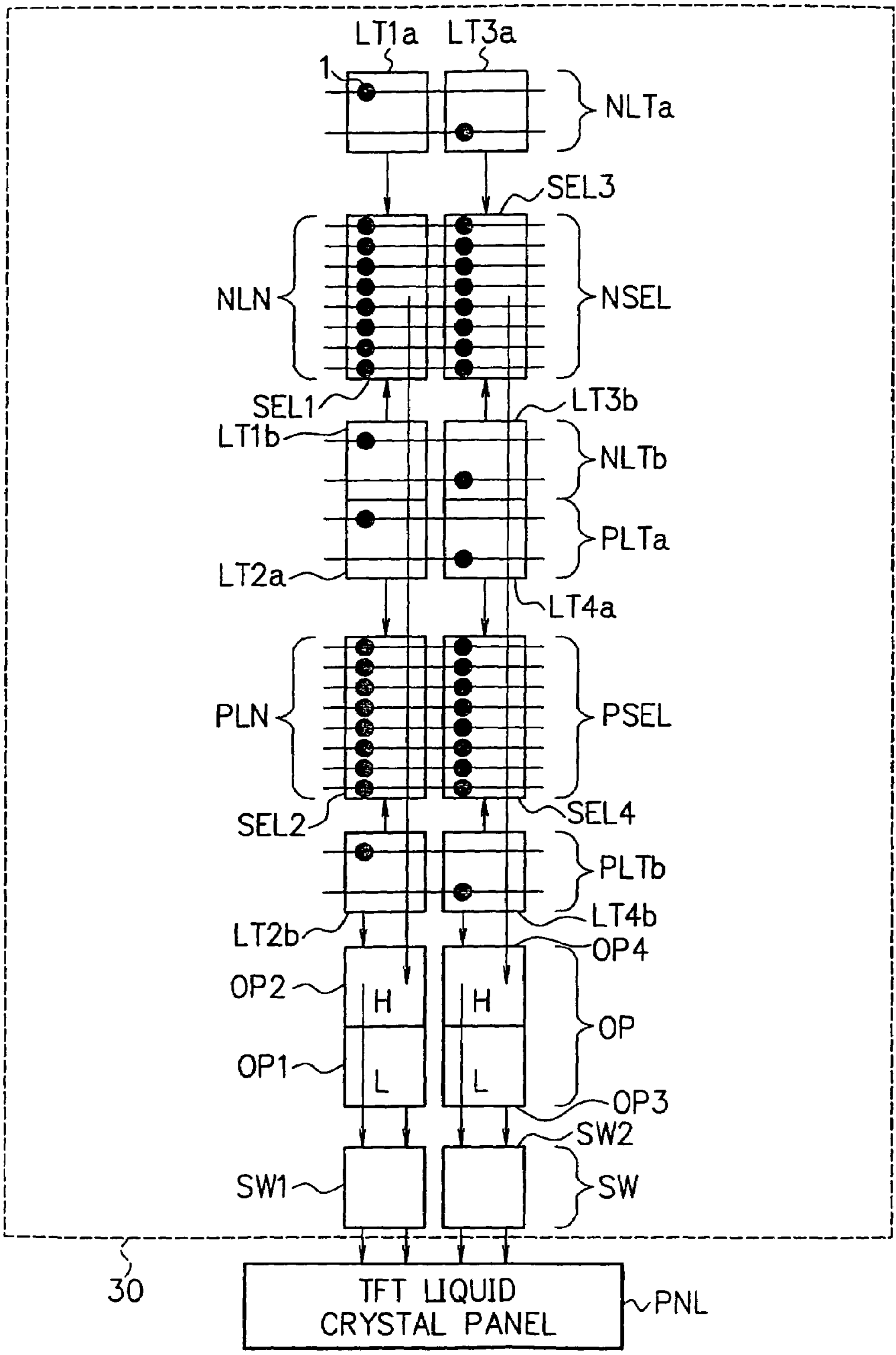
FIG. 6 is an illustration showing a construction of the fifth embodiment of a liquid crystal display apparatus according to the present invention.

FIG. 6 is an illustration showing a construction of the fifth embodiment of the liquid crystal display apparatus according to the present invention. The liquid crystal display apparatus has the TFT liquid crystal panel PNL and the semiconductor integrated circuit 30 for driving the liquid crystal panel PNL. The shown embodiment is differentiated from the first embodiment (FIG. 1) in that the upper level portion of the data latch portion LT is divided into first negative data latch portion NLTa and the second negative data latch portion NLTb, and the lower level portion of the data latch portion LT is divided into first positive data latch portion PLTa and second data latch portion PLTb. Division of the data latch is performed by dividing into half in the sequential order of the digital image data (n bit signal). The areas of data latches NLTa, NLTb, PLTa and PLTb becomes half by division, respectively.

In the shown embodiment of the semiconductor integrated circuit 30, the first negative data latch portion NLTa, the negative selector portion NSEL, the second negative data latch portion NLTb, the first positive data latch portion PLTa, the positive selector portion PSEL, the second positive data latch portion PLTb, the operational amplifier OP and the output switching portion SW are arranged vertically in sequential order. The first negative data latch portion NLTa and the second negative data latch portion NLTb are arranged interposing the negative selector NSEL in vertical direction. Also, the first positive data latch portion PLTa and the second positive data latch portion PLTb are arranged interposing the positive selector PSEL in vertical direction.

In the shown embodiment, the first and second positive data latch portions PLTa and PLTb interposing the positive selector PSEL are taken as positive set, and the first negative data latch portion NLTa and the second negative data latch portion NLTb interposing the negative selector NSEL are taken as negative set. The positive set and the negative set are arranged in alignment in vertical direction. The vertically aligned positive set and negative set is taken as one set. A plurality of sets of the vertically aligned positive and negative sets are arranged in horizontal direction with respect to the positive gradation voltage line PLN and the negative gradation voltage line NLN. At this time, in each set of the vertically aligned positive and negative sets, the positive set and the negative set are arranged so that the second negative data latch portion NLTb and the first positive data latch portion PLTa are located adjacent with each other in vertical direction. This construction is only differentiated in arrangement in relation to the first embodiment (FIG. 1), to achieve the comparable operation and effect to that of the first embodiment set forth above.

Sixth Embodiment

Figure 7:
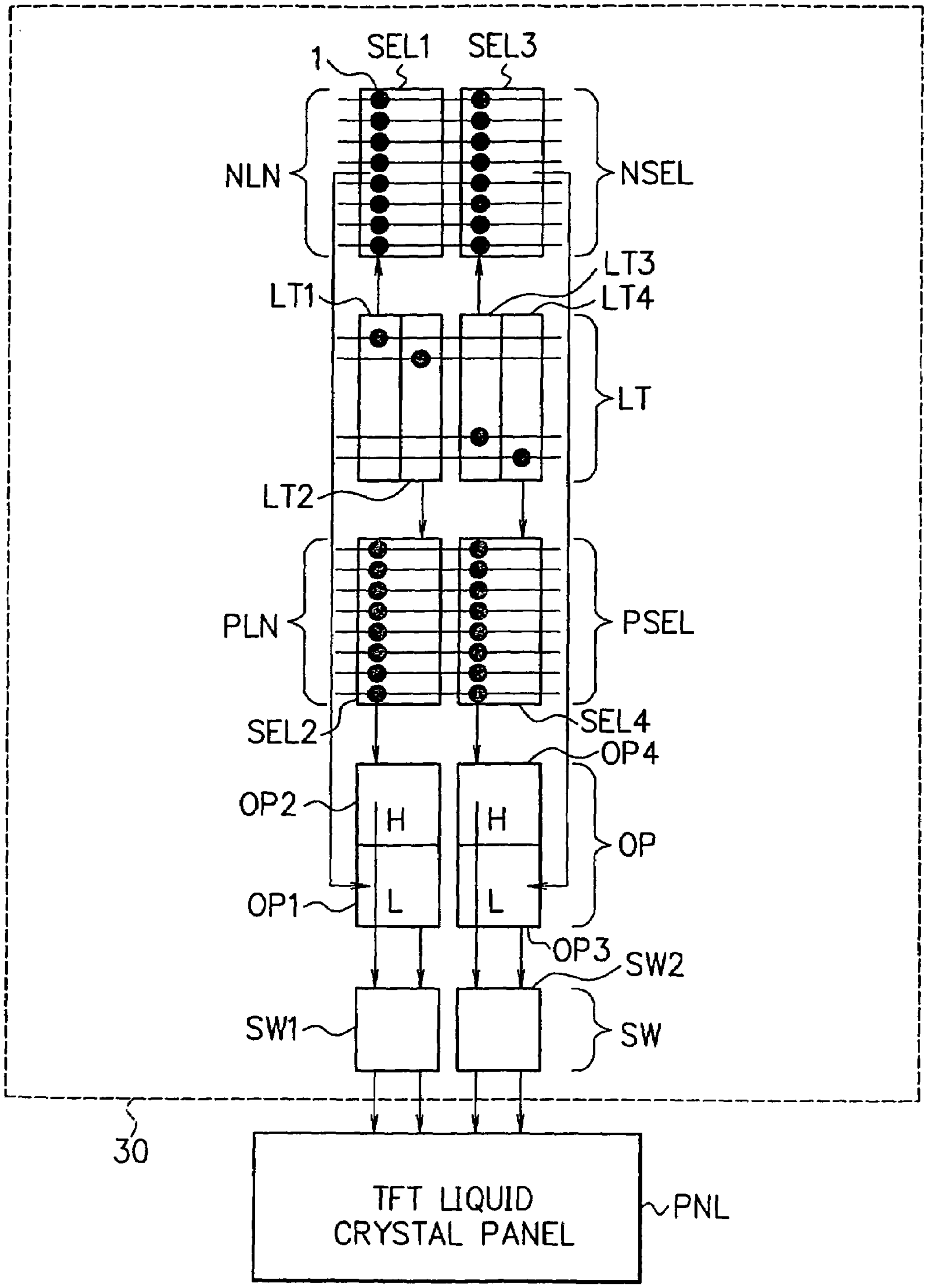
FIG. 7 is an illustration showing a construction of the sixth embodiment of a liquid crystal display apparatus according to the present invention.

FIG. 7 is an illustration showing a construction of the sixth embodiment of the liquid crystal display apparatus according to the present invention. The liquid crystal display apparatus has the TFT liquid crystal panel PNL and the semiconductor integrated circuit 30 for driving the liquid crystal panel PNL. In the first embodiment (FIG. 1), the negative data latches LT1 and LT3 and the positive data latches LT2 and LT4 are placed adjacent in vertical direction, whereas, in the shown embodiment, the negative data latches LT1 and LT3 and the positive data latches LT2 and LT4 are placed adjacent in horizontal direction, respectively.

In the shown embodiment of the semiconductor integrated circuit 30, the negative selector portion NSEL, the data latch portion LT, the positive selector portion PSEL, the operational amplifier OP and the output switching portion SW are aligned in sequential order in vertical direction. Amongst, in the data latch portion LT, the negative data latches LT1 and LT3 and the positive data latches LT2 and LT4 are arranged alternately in horizontal direction.

In the shown embodiment, the negative data latches LT1 and LT3 and the positive data latches LT2 and LT4 are located adjacent in horizontal direction with respect to the positive gradation voltage line PLN and the negative gradation voltage line NLN. This construction is only differentiated in arrangement in relation to the first embodiment (FIG. 1), to achieve the comparable operation and effect to that of the first embodiment set forth above.

Seventh Embodiment

Figure 8:
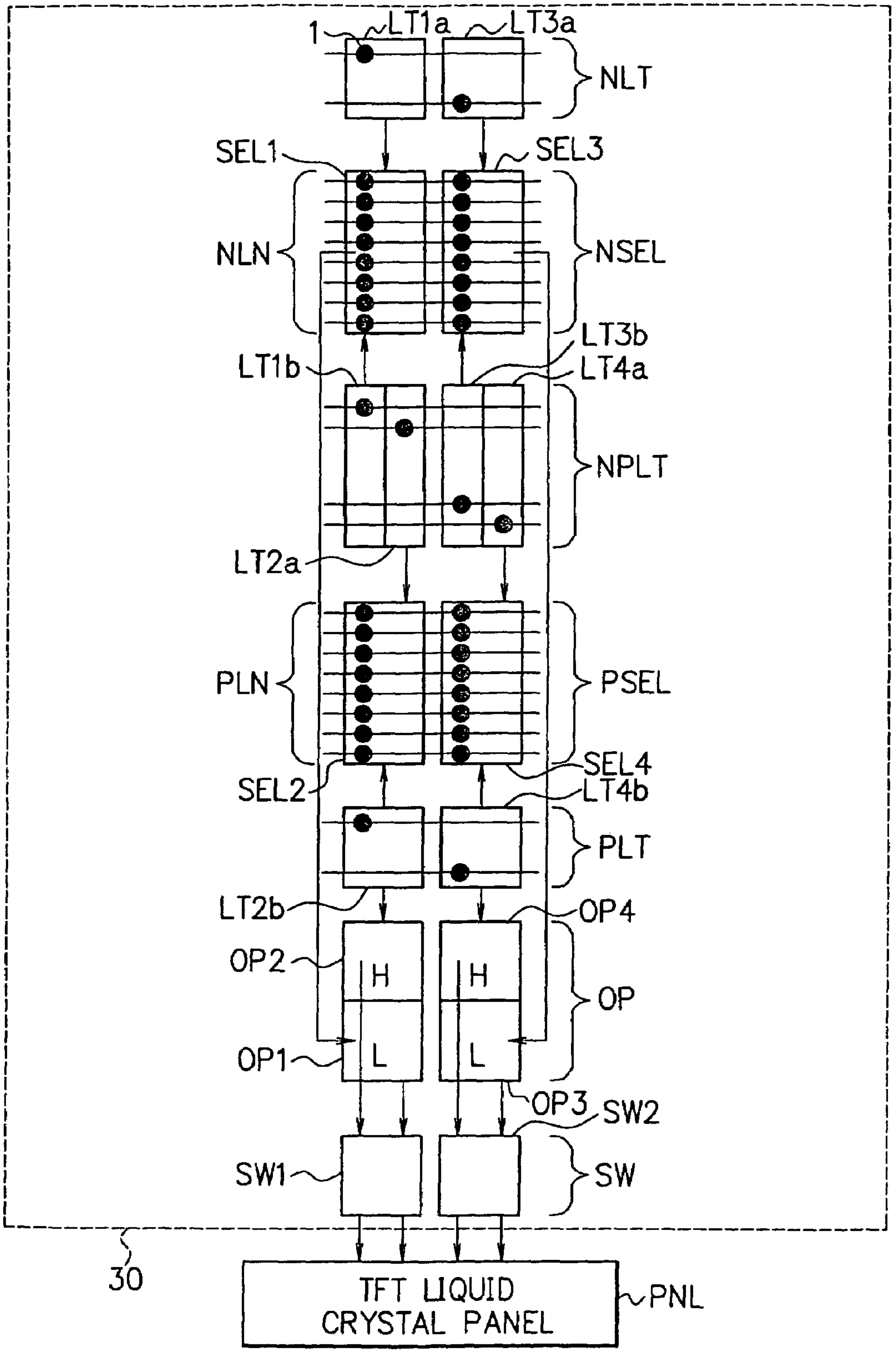
FIG. 8 is an illustration showing a construction of the seventh embodiment of a liquid crystal display apparatus according to the present invention.

FIG. 8 is an illustration showing a construction of the seventh embodiment of the liquid crystal display apparatus according to the present invention. The liquid crystal display apparatus has the TFT liquid crystal panel PNL and the semiconductor integrated circuit 30 for driving the liquid crystal panel PNL. While the second negative data latches LT1*b* and LT3*b* and the first positive data latches LT2*a* and the LT4*a* are placed adjacent with each other in vertical direction in the fifth embodiment (FIG. 6), respectively, the second negative data latches LT1*b* and LT3*b* and the first positive data latches LT2*a* and the LT4*a* are placed adjacent with each other in horizontal direction, respectively, in the shown embodiment.

In the shown embodiment of the semiconductor integrated circuit 30, the first negative data latch portion NLT, the negative selector portion NSEL, the second negative and first positive data latch portion NPLT, the positive selector portion PSEL, the second positive data latch portion PLT, the operational amplifier portion OP and the output switching portion SW are arranged in sequential order in vertical direction. Amongst, the second negative and first positive data latch portion NPLT, the second negative data latches LT1*b* and LT3*b* and the first positive data latches LT2*a* and LT4*a* are arranged alternately in horizontal direction.

In the shown embodiment, the second negative data latches NLT1*b* and NLT3*b* and the first positive data latches PLT1L a and PLT3*a* are placed adjacent with each other in horizontal direction with respect to the positive gradation voltage line PLN and the negative gradation voltage line NLN. This construction is only differentiated in arrangement in relation to the first embodiment (FIG. 1), to achieve the comparable operation and effect to that of the first embodiment set forth above.

Eighth Embodiment

Figure 9:
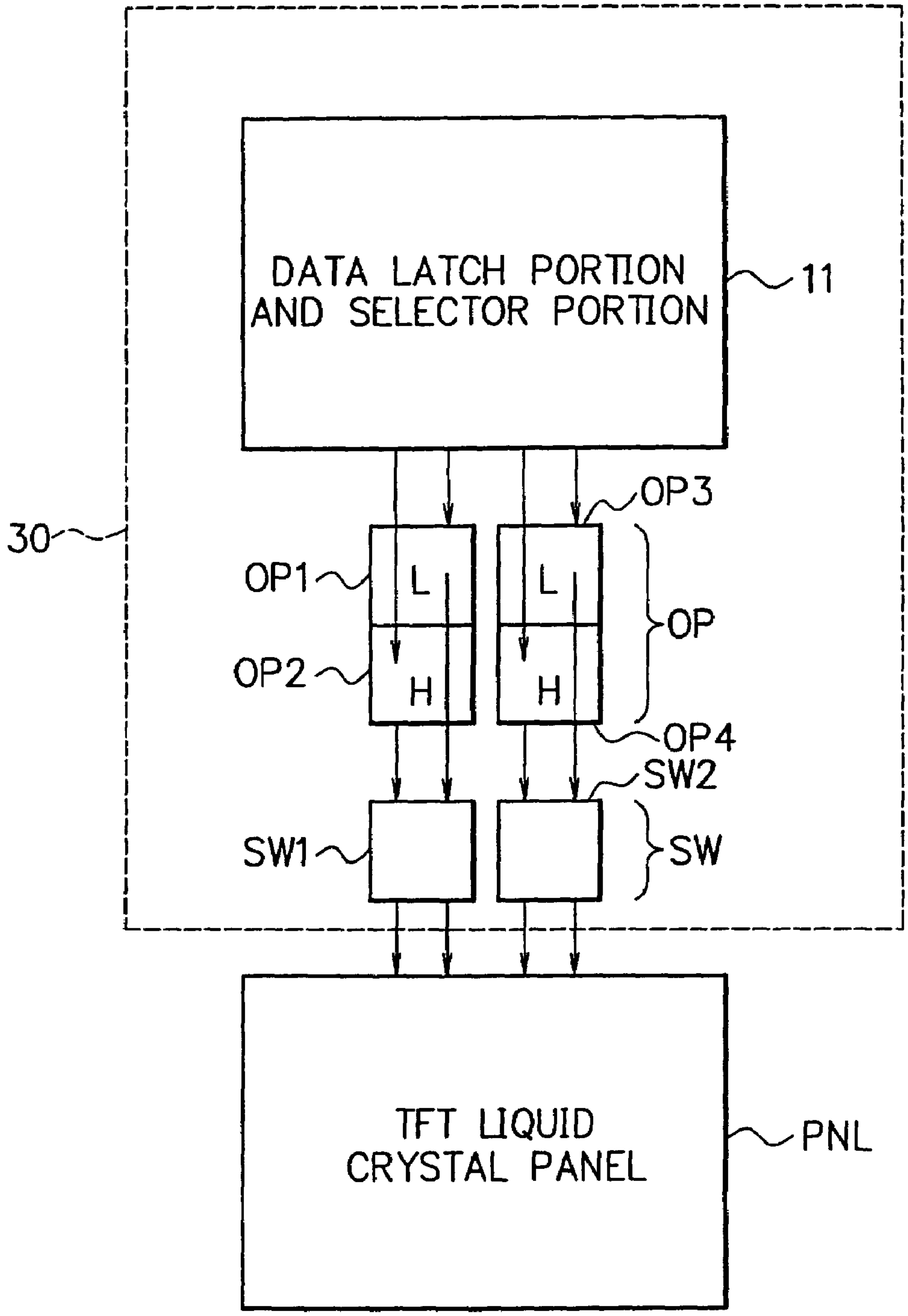
FIG. 9 is an illustration showing a construction of the eighth embodiment of a liquid crystal display apparatus according to the present invention.

FIG. 9 is an illustration showing a construction of the eighth embodiment of the liquid crystal display apparatus according to the present invention. The liquid crystal display apparatus has the TFT liquid crystal panel PNL and the semiconductor integrated circuit 30 for driving the liquid crystal panel PNL. The semiconductor integrated circuit 30 includes a data latch portion and selector portion 11, the operational amplifier portion OP and the output switching portion SW.

The data latch portion and selector portion 11 may be any combination set forth in the first to seventh embodiments.

The operational amplifier OP has negative operational amplifiers OP1 and OP3 and positive operational amplifiers OP2 and OP4. The negative operational amplifiers OP1 and OP3 are arranged at upper level and the positive operational amplifiers OP2 and OP4 are arranged at lower level adjacent the negative operational amplifiers OP1 and OP3.

In the first to eighth embodiments, the negative operational amplifiers OP1 and OP3 and the positive operational amplifiers OP2 and OP4 are arranged adjacent with each other with respect to the positive gradation voltage line LN and the negative gradation voltage line NLN. This construction achieves the comparable operation and effect to that of the first embodiment set forth above.

Ninth Embodiment

Figure 10:
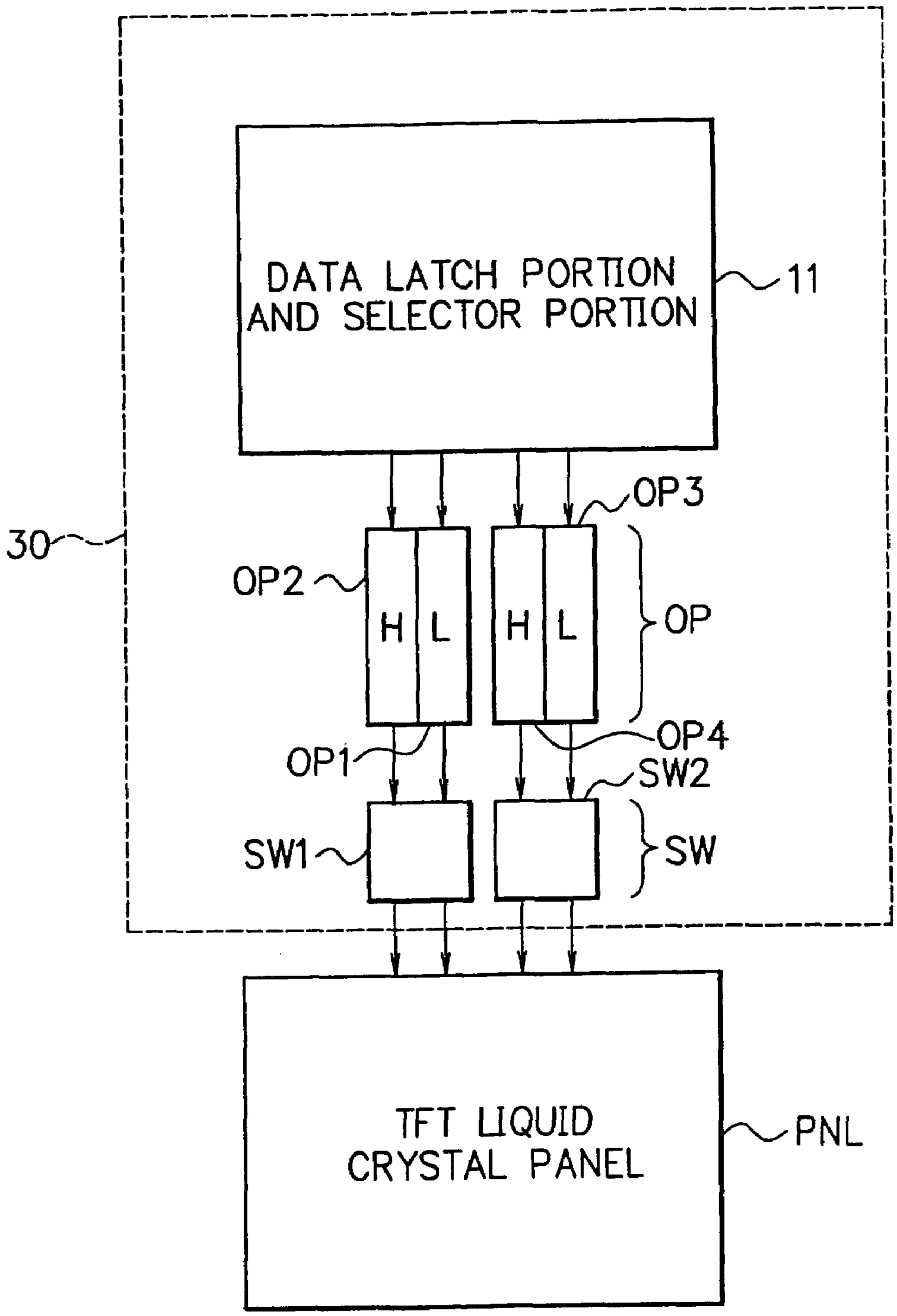
FIG. 10 is an illustration showing a construction of the ninth embodiment of a liquid crystal display apparatus according to the present invention.

FIG. 10 is an illustration showing a construction of the ninth embodiment of the liquid crystal display apparatus according to the present invention. The liquid crystal display apparatus has the TFT liquid crystal panel PNL and the semiconductor integrated circuit 30 for driving the liquid crystal panel PNL. While the negative operational amplifiers OP1 and OP3 and the positive operational amplifiers OP2 and OP4 are placed adjacent with each other in vertical direction in the eighth embodiment (FIG. 9), the shown embodiment arranges the negative operational amplifiers OP1 and OP3 and the positive operational amplifiers OP2 and OP4 alternately in horizontal direction.

In the shown embodiment, the positive operational amplifiers OP2 and OP4 and the negative operational amplifiers OP1 and OP3 are arranged adjacent with each other in horizontal direction respectively with respect to the positive gradation voltage line PLN and the negative gradation voltage line NLN. This construction achieves the comparable operation and effect to that of the first embodiment set forth above.

Tenth Embodiment

Figure 11A:
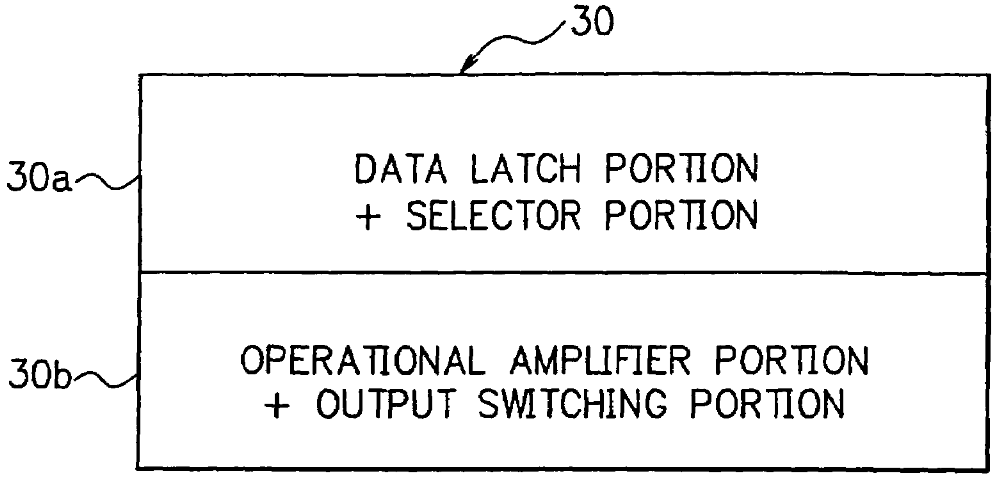
FIGS. 11A and 11B are plan views showing tenth embodiment of a semiconductor integrated circuit for a liquid crystal panel PNL according to the present invention.

FIG. 11A is a plan view showing an example of arrangement of the semiconductor integrated circuit (liquid crystal driver) 30 for the driving the first to ninth embodiments of the liquid crystal panel PNL. The semiconductor integrated circuit 30 has a region 30*a* having the data latch portion and the selector portion, and a region having the operational amplifier portion and the output switching portion.

In the shown embodiment, a region 30*a* of the positive and negative data latches and the positive and negative selector NSEL is arranged at only one side of the region 30*b* of the positive and negative operational amplifiers and the output switching portion.

Figure 11B:
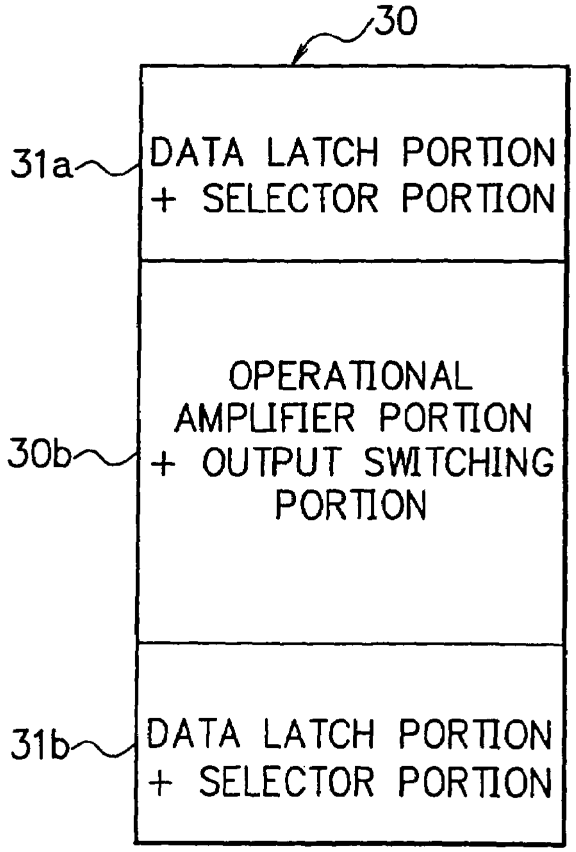

FIG. 11B is a plan view showing an example of arrangement of the tenth embodiment of the semiconductor integrated circuit 30 for driving the liquid crystal panel PNL (liquid crystal driver). In the shown embodiment, the tenth embodiment of the region 30*a* of the data latch portion and the selector portion is divided into a region 31*a* of the first data latch portion and selector portion and a region 31*b* of the second data latch portion and the selector portion. Across the region 30*b* of the operational amplifier portion and the output switching portion, the region 31*a* of the first data latch portion and selector portion and the region 31*b* of the second data latch portion and the selector portion are arranged adjacent with each other.

In the shown embodiment, the regions 31*a* and 31*b* of the positive and negative data latches and the positive and negative selectors are arranged on both sides of the region 30*b* of the positive and negative operational amplifiers and the output switching portion adjacent therewith. This construction achieves the comparable operation and effect to that of the first embodiment set forth above.

On the other hand, in the shown embodiment, the region 30*b* of the operational amplifier portion and the output switching portion are arranged at the center portion of the semiconductor integrated circuit 30. Since a bonding pad can be provided in the region 30*b* having the output terminal of the output switching portion SW, a flip chip can be formed easily. Namely, when a normal dual like type IC (integrated circuit) and so forth is to be formed, it is preferred to provide the bonding pad at the end of the semiconductor integrated circuit 30. However, when the flip chip is to be formed, a package size can be made smaller by direct wiring by TAB (tape automated bonding) or the like instead of using a lead frame.

As set forth in detail, in the first to tenth embodiments, since the positive sets and the negative sets are arranged in parallel in horizontal direction, the length of the semiconductor integrated circuit 30 in horizontal direction becomes half of the length of the semiconductor integrated circuit 40 of FIG. 21 to make the area of the semiconductor integrated circuit 30 smaller.

On the other hand, in the semiconductor integrated circuit 40 of FIG. 21, the non-used region (hatched region in the drawing) 2 is formed. In contrast to this, the shown embodiment of the semiconductor integrated circuit 30 does not form the non-used region to permit efficient layout of wiring of the negative selector portion NSEL and the positive selector portion PSEL. Thus, as a whole, the area of the semiconductor integrated circuit 30 can be made smaller.

On the other hand, in the semiconductor integrated circuit of FIG. 21, a sufficiently large distance has to be provided between the selectors SEL of different channel types. However, since the shown embodiment of the semiconductor integrated circuit 30 employs the transistors of the same channel type adjacent in horizontal direction, a distance between the selectors adjacent in horizontal direction can be shortened to permit an area of the semiconductor integrated circuit 30.

Eleventh Embodiment

Figure 12:
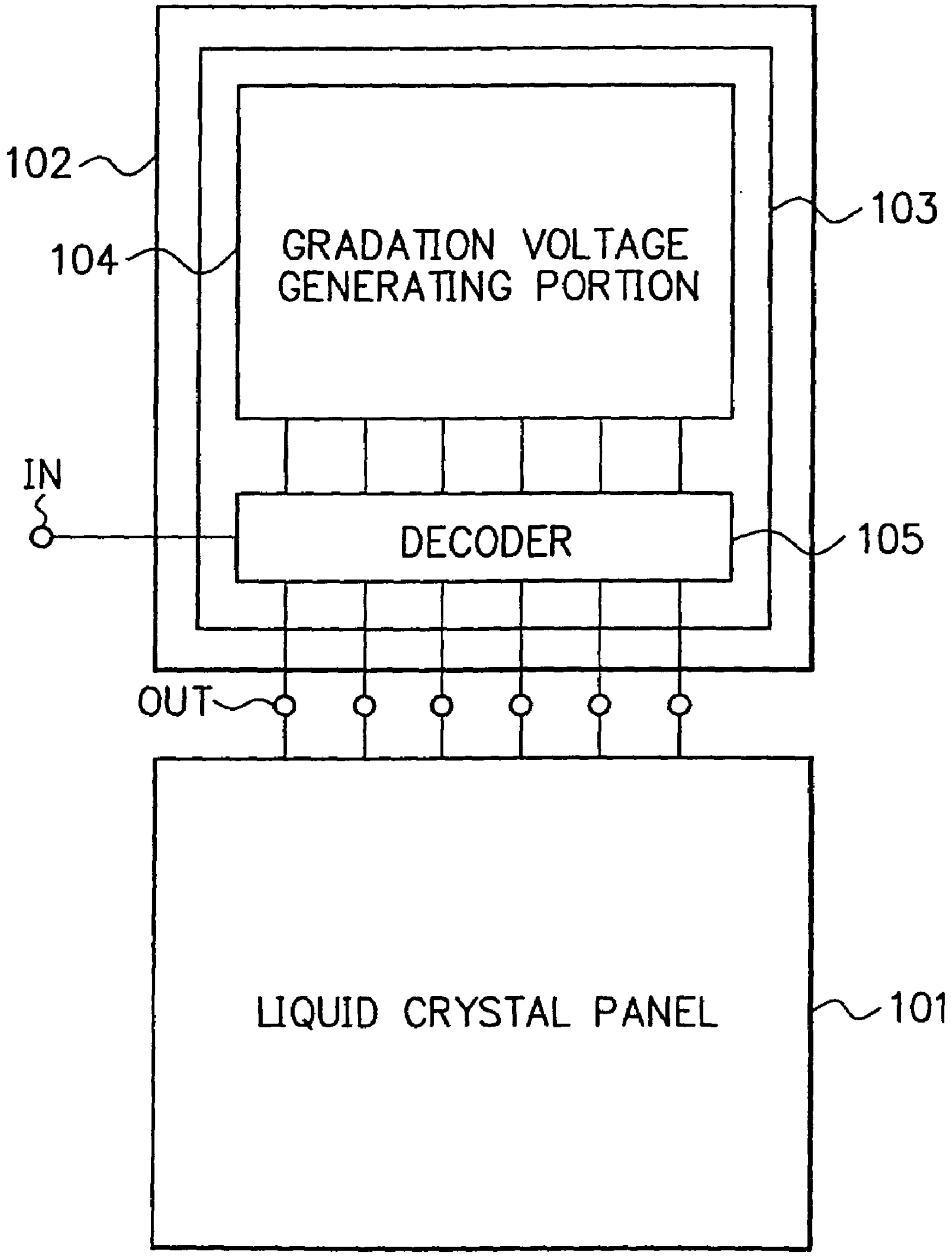
FIG. 12 is a block diagram showing a construction of the eleventh embodiment of a liquid crystal display according to the present invention.

FIG. 12 is a block diagram showing a construction of the eleventh embodiment of the liquid crystal display. The liquid crystal display has a liquid crystal panel PNL 101 and a driver 102 for a liquid crystal display. The driver 102 for the liquid crystal display includes a D/A converter 103 converting a digital gradation value input to an input terminal IN into an analog gradation value to output to an output terminal OUT. The D/A converter 103 has a gradation voltage generating portion 104 and a decoder 105.

The gradation voltage generating portion 104 and the decoder 105 are connected with each other with sixty-four gradation wiring, for example. In the input terminal IN, a gradation value of each pixel of the liquid crystal panel PNL 101 is input by a digital value. The gradation voltage generating portion 104 generates an analog voltage of sixty-four gradation level, for example, to output to the decoder 105 via the sixty-four gradation wiring. The decoder 105 converts the digital gradation value input to the input terminal IN into the analog gradation value on the basis of the analog gradation voltage value output from the gradation wiring of the gradation voltage generating portion 104 to output to the output terminal OUT. The liquid crystal panel PNL 101 receives the analog gradation voltage of each pixel from the decoder 105 via output terminal OUT. The driver 102 for the liquid crystal display drives the liquid crystal panel PNL 101 by controlling the gradation value of each pixel of the liquid crystal panel PNL 101. The liquid crystal panel PNL 101 displays each pixel having the given gradation value.

Figure 13:
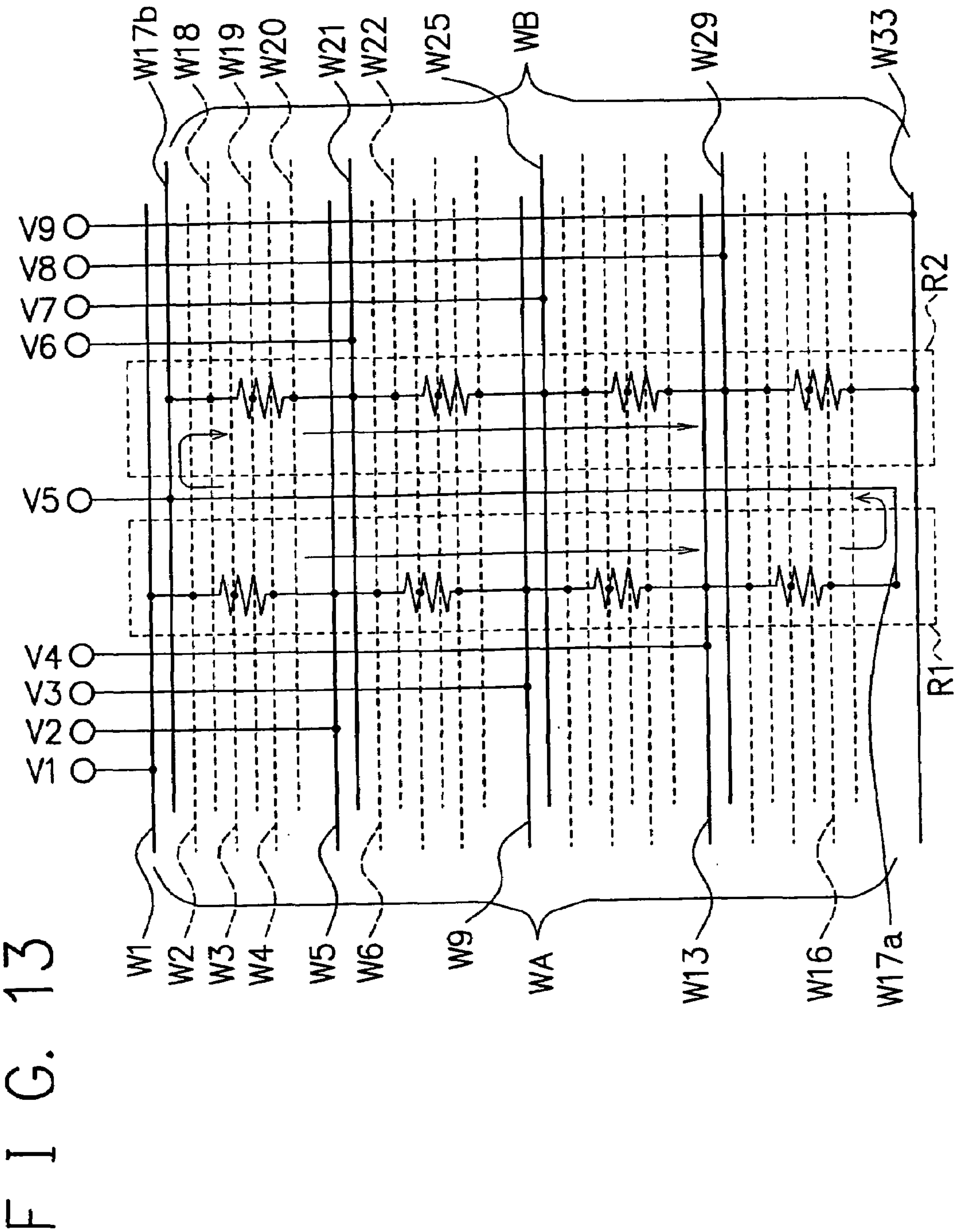
FIG. 13 is a wire diagram showing a construction of a gradation voltage generating portion in the eleventh embodiment of the liquid crystal display.

FIG. 13 is a wire diagram showing a construction of the gradation voltage generating portion 104 in the eleventh embodiment of the liquid crystal display which corresponds to the negative selector portion NSEL or the positive selector portion PSEL of FIG. 1 or the like. The gradation voltage generating portion 104 in the shown embodiment is formed by arranging the front half gradation wiring WA and the rear half gradation wiring WB in the gradation voltage generating portion shown in FIG. 22 in comb teeth fashion in the same layer.

The gradation voltage generating portion 104 has reference voltage input terminals (IC pads) V1 to V9, the front half gradation wiring WA, the rear half gradation wiring WB and the ladder resistors R1 and R2. Hereinafter, the gradation wiring, in which the gradation wiring WA and the gradation wiring WB are combined, is referred to as gradation wiring WW.

The gradation wiring WW has sixty-four gradation wiring corresponding to the sixty-four gradation levels, for example, in practice. However, the following discussion will be given for an example where thirty-three gradation wiring W1 to W33 are provided for simplification of illustration. The gradation wiring W1 to W33 are gradation wiring for outputting voltage at each gradation level. The gradation wiring W1 is the wiring for outputting a voltage indicative of the minimum gradation value, and the gradation wiring W33 is the gradation wiring for outputting a voltage indicative of the maximum gradation value.

The front half gradation wiring WA includes sixteen gradation wiring W1 to W16 for outputting a voltage of an approximately half gradation area on lower gradation value side as divided the overall gradation level number into two. The rear half of the gradation wiring WB includes seventeen gradation wiring W17*b* to W33 for outputting a voltage of an approximately half gradation area on higher gradation value side as divided the overall gradation level number into two.

Between respective gradation wiring W1 to W16 of the front half gradation wiring WA, a first ladder resistor R1 is connected, and between respective gradation wiring W17*b* to W33 of the rear half gradation wiring WA, a second ladder resistor R2 is connected. The input terminal V1 is connected to the gradation wiring W1 indicative of the minimum gradation level. The input terminal V2 is connected to the gradation wiring W5, the input terminal V3 is connected to the gradation wiring W9, the input terminal V4 is connected to the gradation wiring W13, the input terminal V5 is connected to the gradation wiring W17*a* and W17*b* indicative of the intermediate gradation level, the input terminal V6 is connected to the gradation wiring W21, the input terminal V7 is connected to the gradation wiring W25, the input terminal V8 is connected to the gradation wiring W29 and the input terminal V9 is connected to the gradation wiring W33 indicative of the maximum gradation level.

Figure 14:
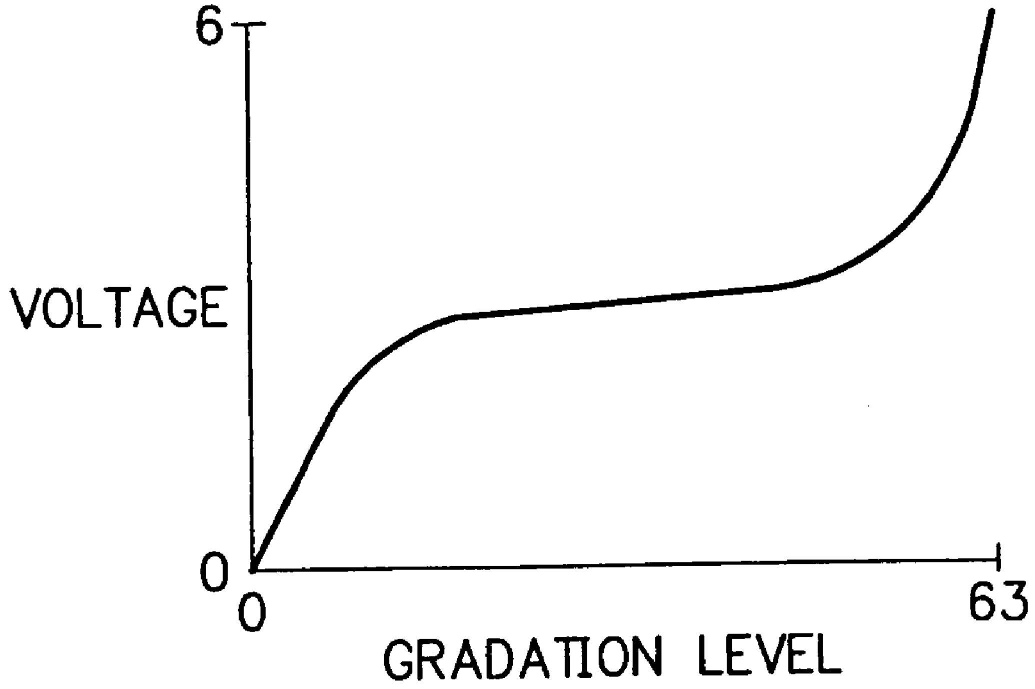
FIG. 14 is a graph showing a relationship between a gradation value and a voltage.

The gradation wiring W1 to W33 is connected to the liquid crystal panel PNL 101 via the decoder 105 of FIG. 12. By applying the following reference voltage to the input terminals V1 to V9, the liquid crystal panel PNL 101 can be driven. Namely, for example, 0V is applied to the input terminal V1, 6V is applied to the input terminal V9 and voltages interpolating 0 to 6V are applied to the input terminals V2 to V8. Then, the voltages on the gradation wiring W1 to W33 are divided by ladder resistors R1 and R2 for outputting a voltage between 0 to 6V for which γ correction is operation and effected, as shown in FIG. 14. In FIG. 14, axis of abscissas represents the gradation value and axis of ordinates represents an output voltage of the gradation wiring corresponding to the gradation value. Depending upon γ characteristics shown in FIG. 14, the values of the reference voltage input to the input terminals V2 to V8 are determined.

It should be noted that while discussion has been illustrated for the case where nine input terminals V1 to V9 are present in FIG. 13, number of the input terminals can be determined arbitrarily depending upon a characteristic curve of γ correction. It should be noted that among the front half gradation wiring WA, at least two gradation wiring W1 and W4 are connected to the input terminals V1 and V4, and among the rear half gradation wiring WB, at least two gradation wiring W17*a* (W17*b*) and W33 are connected to the input terminals V5 and V9.

When the foregoing reference voltages are applied to the input terminals V1 to V9, a current flows from the upper side to the lower side in the drawing, namely from the gradation wiring W1 of smaller gradation value to the gradation wiring W17*a* of greater gradation value in the first ladder resistor R1. Since the left lower gradation wiring 17*a* is connected to the right upper gradation wiring W17*b* are connected, even in the second ladder resistor R2, the current flows from the upper side to the lower side, namely from the gradation wiring W17*b* of smaller gradation value to the gradation wiring W33 of greater gradation value. The direction to flow the current in the first ladder resistor R1 and the direction to flow the current in the second ladder resistor R2 are the same. By this, in the gradation wiring W1 to W33, voltages respectively divided by the ladder resistors R1 and R2 appear. In particular, the voltage values of respective gradation levels appear in FIG. 14.

Next, discussion will be given for a stress test method. Between respective gradation wiring W1 to W33, the ladder resistors R1 and R2 are connected. In the fabrication process of the driver 102 (FIG. 12) for the liquid crystal display, it is possible to penetrate foreign matter (dust) between the gradation wiring or to cause tolerance in the process steps to cause insulation failure between the gradation wiring. The driver 102 for the liquid crystal display causing insulation failure is disposed as defective product. The insulation failure between the gradation wiring can be detected by the stress test which will be discussed hereinafter. In the stress test, at first, a stress voltage application process is performed, and subsequently, an inspection process is performed.

Discussion will be given for the stress voltage application process. In the stress voltage application process, 0V is applied for the input terminals V1, V2, V3 and V4 and a stress voltage (maximum rated voltage) of 12V is applied to the input terminals V5, V6, V7, V8 and V9. By applying the stress voltage, if the insulation failure is present between the gradation wiring, insulation failure between the gradation wiring becomes elicited.

Upon application of the stress voltage, since the same potential of 0V is applied to the input terminals V1 to V4, even when voltage division is operation and effected by the ladder resistor R1, all 0V of gradation voltage appear on W1 to W13. On the other hand, since the same potential of 12V is applied to all of input terminals V5 to V9, even when voltage division is operation and effected by the ladder resistor R2, all 12V of gradation voltage appear on W17*b* to W33. As set forth above, since 0V is applied to the input terminal V1 and 12V is applied to the input terminal V5, sufficiently high stress voltage of 12V is applied between the gradation wiring W1 and the gradation wiring W17*b*. On the other hand, since 0V is applied to the gradation wiring W2 from the input terminals V1 and V2 via the first ladder resistor R1, the high stress voltage of 12V is applied even between the gradation wiring W2 and the gradation wiring W17*b*. Similarly, expect for the zone set out later, the high stress voltage of 12V is applied between respective gradation wiring to ensure detection of the insulation failure between the gradation wiring.

Figure 22:
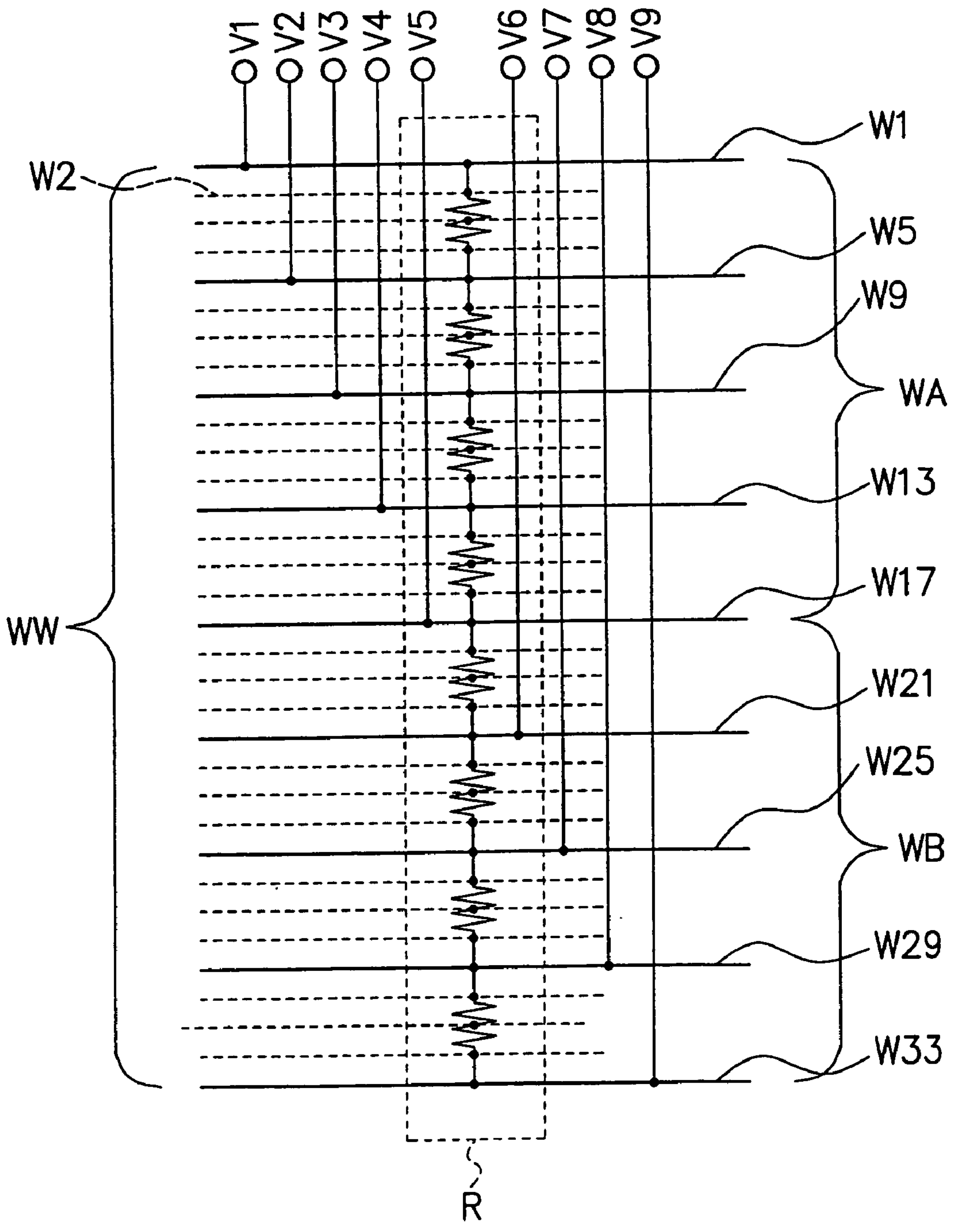
FIG. 22 PRIOR ART
FIG. 22 is a wire diagram showing a construction of the conventional gradation voltage generating portion.

Namely, in the conventional gradation voltage generating portion shown in FIG. 22, the stress voltage of 12V is applied only between the gradation wiring W1 and W5, to apply only low voltage of about 3V (=12V+4) between respective gradation voltages. On the other hand, in the gradation voltage generating portion 104 in the shown embodiment, the high stress voltage of 12V can be applied between respective gradation wiring except for a part of zone to ensure detection of insulation failure between the gradation wiring.

On the other hand, in the conventional gradation voltage generating portion shown in FIG. 22, at first, the stress voltage is applied between the input terminals V1 and V2, next, the stress voltage is applied between the input terminals V2 and V3, and similarly, the stress voltage is applied between respective input terminals V3 to V9. Thus, the stress voltage application process has to be repeated for eight times. In contrast to this, in the shown embodiment of the gradation voltage generating portion 104, 0V is applied to the input terminals V1 to V4 and 12V is applied to the input terminals V5 to V9 at complete the stress voltage application process at one time, to complete the stress voltage application process in short period. By this, insulation failure between the gradation wiring can be detected in a short period.

It should be noted that the shown embodiment of the stress voltage application process is not limited in the case where 12V is applied to the intermediate reference voltage input terminal V5, but can apply 0V. Namely, it is possible to apply 0V to the input terminals V1 to V5 and to apply 12V to the input terminals V6 to V9. When 12V is applied to the input terminals V5 to V9. since 12V of voltage is applied from the gradation wiring W13 to the gradation wiring W17*a* through the first ladder resistor R1 to cause voltage drop. Therefore, only between the gradation wiring W13 to the gradation wiring W17*a*, the high stress voltage of 12V cannot be applied. In this case, by applying 0V to the input terminals V1 to V5 and 12V to the input terminals V6 to V9 after application of 0V to the input terminals V1 to V4 and 12V to the input terminals V5 to V9, the foregoing problem can be solved. Another gradation voltage generating portion 104 solving the problem set forth above will be discussed later with reference to FIG. 16.

After application of the stress voltage, the inspection process is performed. In the inspection process, similarly to the normal driving of the liquid crystal panel PNL, 0V is applied to the input terminal V1, for example, and 6V is applied to the input terminal V9, and voltage interpolating between 0 to 6V to the input terminals V2 to V8. The output voltage of respective gradation wiring W1 to W33 is measured. If the output voltage is not within a range of the given value, the driver 102 for the liquid crystal display can be rejected as defective product. In the stress voltage application process, insulation failure between the gradation wiring can be made elicited to ensure detection of insulation failure between the gradation wiring in the inspection process.

Twelfth Embodiment

Figure 15:
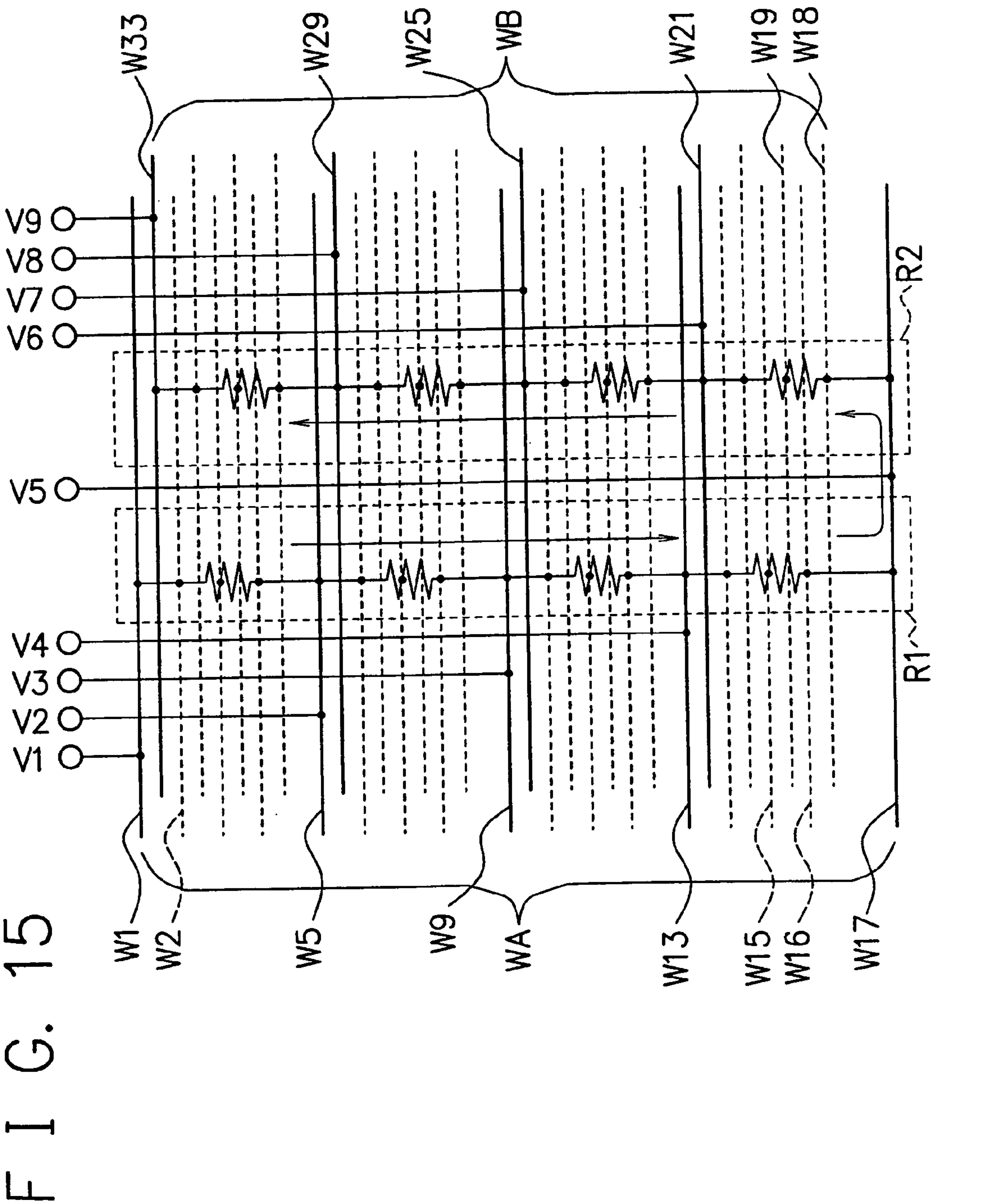
FIG. 15 is a wire diagram showing a construction of a gradation voltage generating portion in the twelfth embodiment of the liquid crystal display.

FIG. 15 is a wire diagram showing a construction of the twelfth embodiment of the gradation voltage generating portion 104 according to the present invention. In the eleventh embodiment shown in FIG. 13, the rear half gradation wiring WB is formed by arranging the gradation wiring W17*b* to W33 with placing the gradation wiring W17*b* having smaller gradation value at upper side and the gradation wiring W33 having greater gradation value at lower side. In contrast to this, in the shown embodiment, the rear half gradation wiring WB is formed by arranging the gradation wiring W18 to W33 with placing the gradation wiring W18 having smaller gradation value at lower side and the gradation wiring W33 having greater gradation value at upper side. On the other hand, two gradation wiring 17*a* and 17*b* are provided at the lowermost position as single gradation wiring 17. In the shown embodiment, the front half of the gradation wiring WA is similar to the front half the gradation wiring WA of the eleventh embodiment.

The front half gradation wiring WA includes seventeen gradation wiring W1 to W17 in order to output voltages of approximately half of a gradation range of smaller gradation values. The rear half gradation wiring WB includes sixteen gradation wiring W18 to W33 for outputting the voltage of approximately half range of the gradation range of greater gradation values.

Between respective gradation wiring W1 to W17 in the front half gradation wiring WA, the first ladder resistor R1 is connected. Between respective gradation wiring W18 to W33 in the rear half gradation wiring WB, the second ladder resistor R2 is connected. Connection between the input terminals V1 to V4 and the gradation wiring WA is the same as that in the eleventh embodiment. The input terminal V5 is connected to the gradation wiring W17. The input terminal V6 is connected to the gradation wiring W21, the input terminal V7 is connected to the gradation wiring W25, the input terminal V8 is connected to the gradation wiring W29, the input terminal V9 is connected to the gradation wiring W33.

In the construction as set forth above, by applying the reference voltages the same as that applied in the eleventh embodiment to the input terminals V1 to V9, the liquid crystal panel PNL 101 can be driven. Namely, 0V is applied to the input terminal V1, 6V is applied to the input terminal V9 and voltages interpolating 0 to 6V are applied to the input terminals V2 to V8. When the foregoing reference voltages are applied to the input terminals V1 to V9, the current flows through the first ladder resistor R1 from upper side to the lower side, namely from the gradation wiring W1 having smaller gradation value to the gradation wiring W17 having larger gradation value. Since the second ladder resistor R2 is connected to the first ladder resistor R1 through the gradation wiring W17, the current flow through the second ladder resistor R1 from lower side to the upper side, namely from the gradation wiring W17 having smaller gradation value to the gradation wiring W33 having larger gradation value. Thus, flow directions of the current in the first ladder resistor R1 and the second ladder resistor R2 are mutually opposite directions. By this, in the gradation wiring W1 to W33, voltages divided by the resistors in the first and second ladder resistors R1 and R2 appear. In particular, the voltage values of respective gradation levels shown in FIG. 14 appear on respective resistors of the first and second ladder resistors R1 and R2.

On the other hand, the stress test is performed in the same method as that for the eleventh embodiment to attain the same result. Namely, the high stress voltage of 12V can be applied between respective gradation resistors, insulation failure between the gradation wiring can be certainly detected. Also, the stress test can be performed in a short period.

Thirteenth Embodiment

Figure 16:
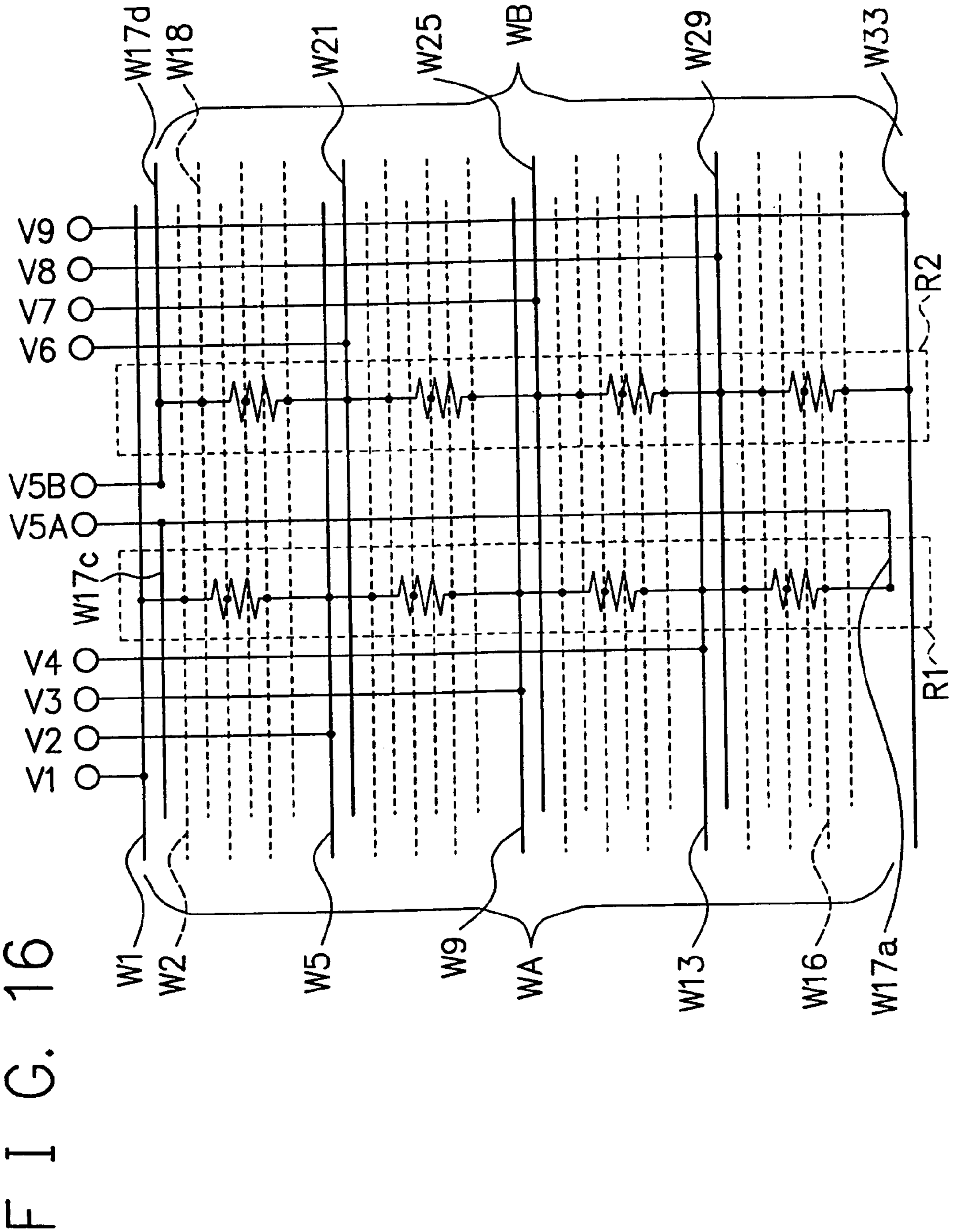
FIG. 16 is a wire diagram showing a construction of a gradation voltage generating portion in the thirteenth embodiment of the liquid crystal display.

FIG. 16 is a wire diagram showing a construction of the thirteenth embodiment of the gradation voltage generating portion 104. The thirteenth embodiment is formed by dividing the intermediate input terminal V5 in the eleventh embodiment of FIG. 13 into two input terminals V5A and V5B, and remaining points are the same as the eleventh embodiment.

Among the rear half gradation wiring WB, the gradation wiring having the smallest gradation value is separated into a gradation wiring W17*c* and a gradation wiring W17*d*. One of the gradation wiring W17*c* is used only for the stress test and the other gradation wiring W17*d* is used as the gradation wiring for actually outputting the gradation voltage. The first ladder resistor R1 is connected between the gradation wiring W1 to W17*a* and the second ladder resistor R2 is connected between the gradation wiring W17*d* and W33. The input terminal V5A is connected to the gradation wiring W17*a* and W17*c*, and the input terminal V5B is connected to the gradation wiring W17*d*.

Next, the stress voltage application process will be discussed. In the stress voltage application process, 0V is applied to the input terminals V1, V2, V3, V4 and V5A, for example, and the stress voltage (maximum rated voltage) of 12V is applied to the input terminals V5B, V6, V7, V8 and V9, for example. In the eleventh embodiment shown in FIG. 13, the large stress voltage cannot be applied to between the gradation wiring W13 to the gradation wiring W17*a*. In contrast to this, in the shown embodiment, 0V of the same potential is applied to the input terminals V4 and V5A connected to the gradation wiring W13 and W17*a* and 12V is applied to the input terminals V5B and V6, the stress voltage of 12V can be applied between the gradation wiring even in the range from the gradation wiring W13 to the gradation wiring W17*a*. Namely, between all of the gradation wiring, the large stress voltage of 12V can be applied to more certainly detect the insulation failure between the gradation wiring.

It should be noted that when the inspection process and normal driving of the liquid crystal are performed after application of the stress voltage, a circuit equivalent to the eleventh embodiment (FIG. 13) can be formed in the shown embodiment by applying the same voltage to the input terminals V5A and V5B to perform equivalent operation.

Fourteenth Embodiment

Figure 17:
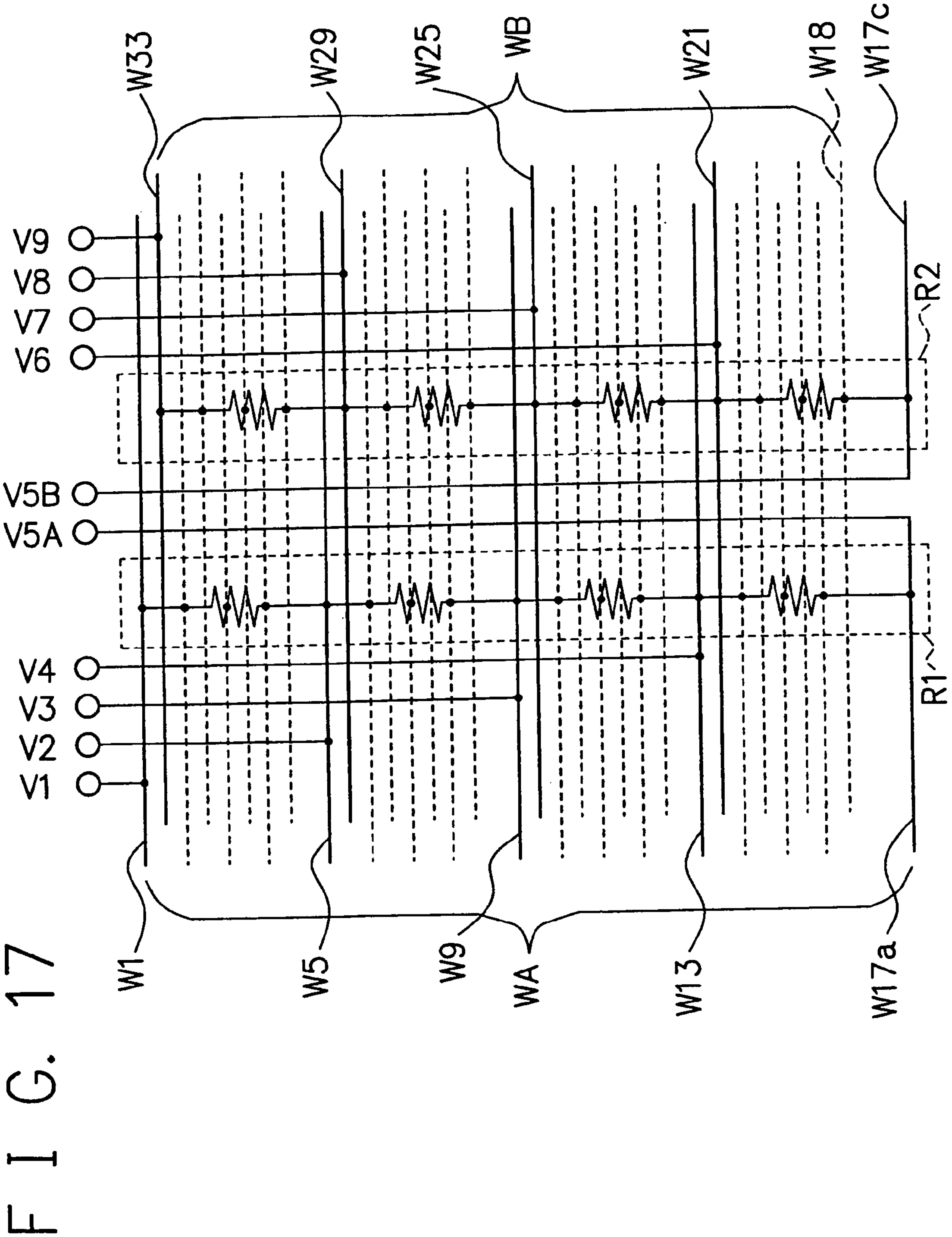
FIG. 17 is a wire diagram showing a construction of a gradation voltage generating portion in the fourteen embodiment of the liquid crystal display.

FIG. 17 is a wire diagram showing a construction of the fourteenth embodiment of the gradation voltage generating portion 104. The fourteenth embodiment is formed by dividing the intermediate input terminal V5 in the twelfth embodiment of FIG. 15 into two input terminals V5A and V5B, and remaining points are the same as the twelfth embodiment.

Among the front half gradation wiring WA, the gradation wiring having the largest gradation value is separated into a gradation wiring W17*a* and a gradation wiring W17*c*. One of the gradation wiring W17*c* is used only for the stress test and the other gradation wiring W17*a* is used as the gradation wiring for actually outputting the gradation voltage. The first ladder resistor R1 is connected between the gradation wiring W1 to W17*a* and the second ladder resistor R2 is connected between the gradation wiring W17*c* and W33. The input terminal V5A is connected to the gradation wiring W17*a*, and the input terminal V5B is connected to the gradation wiring W17*c*.

Next, the stress voltage application process will be discussed. In the stress voltage application process, 0V is applied to the input terminals V1, V2, V3, V4 and V5A, for example, and the stress voltage (maximum rated voltage) of 12V is applied to the input terminals V5B, V6, V7, V8 and V9, for example. In the twelfth embodiment shown in FIG. 15, the large stress voltage cannot be applied to between the gradation wiring W13 to the gradation wiring W17. In contrast to this, in the shown embodiment, 0V of the same potential is applied to the input terminals V4 and V5A connected to the gradation wiring W13 and W17*a* and 12V is applied to the input terminals V5B and V6, the stress voltage of 12V can be applied between the gradation wiring even in the range from the gradation wiring W13 to the gradation wiring W17. Namely, between all of the gradation wiring, the large stress voltage of 12V can be applied to more certainly detect the insulation failure between the gradation wiring.

It should be noted that when the inspection process and normal driving of the liquid crystal are performed after application of the stress voltage, a circuit equivalent to the twelfth embodiment (FIG. 15) can be formed in the shown embodiment by applying the same voltage to the input terminals V5A and V5B to perform equivalent operation.

Fifteenth Embodiment

Figure 18:
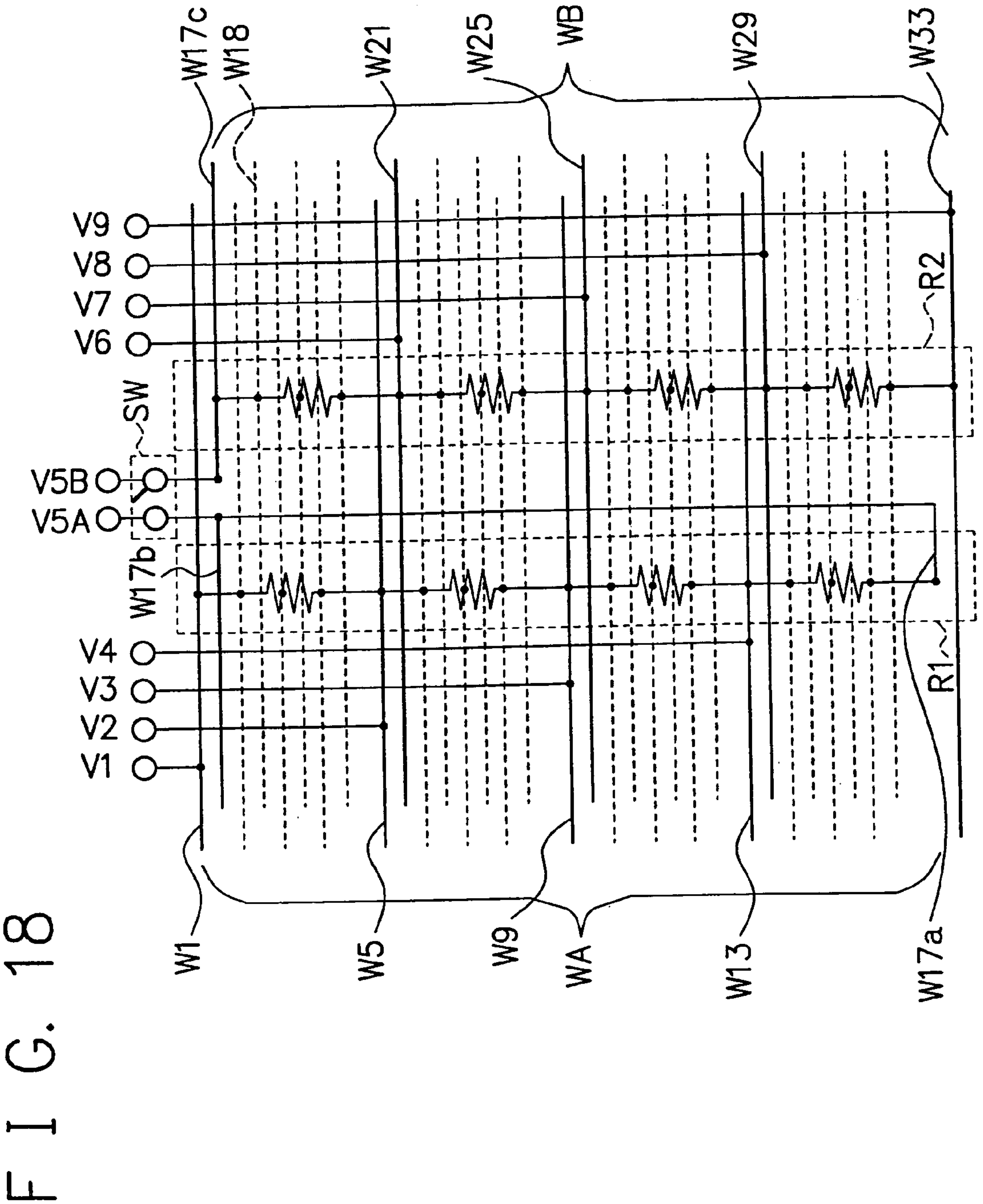
FIG. 18 is a wire diagram showing a construction of a gradation voltage generating portion in the fifteenth embodiment of the liquid crystal display.

FIG. 18 is a wire diagram showing a construction of the fifteenth embodiment of the gradation voltage generating portion 104. The shown embodiment is differentiated from the thirteenth embodiment illustrated in FIG. 16 in that a switch SW is disposed between the intermediate input terminals V5A and V5B, and remaining are the same as the thirteenth embodiment.

The switch SW can connect and disconnect between the input terminals V5A and V5B. In the shown embodiment, similarly to the thirteenth embodiment (FIG. 16), during the stress voltage application process, the switch SW disconnects the input terminals V5A and V5B and during the inspection process and the normal liquid crystal driving state, the switch SW establishes connection between the input terminals V5A and V5B. It should be noted that similarly, the switch SW may be provided between the input terminals V5A and V5B of the fourteenth embodiment (FIG. 17).

Figure 19:
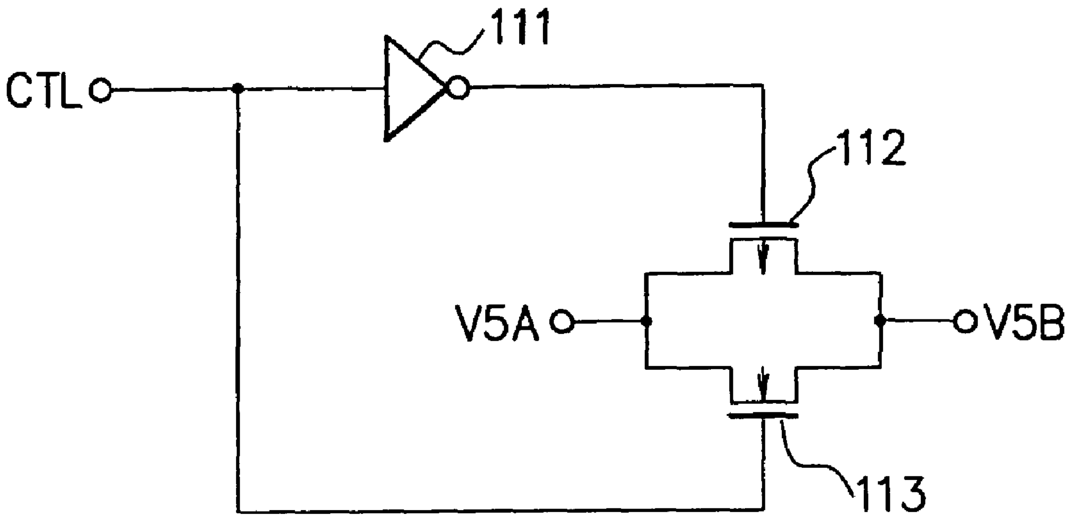
FIG. 19 is a circuit diagram showing a construction of a switch.

FIG. 19 is a circuit diagram showing a construction of the switch SW. The switch SW includes a combined element of a P-channel MOS transistor (transfer gate) 112 and a N-channel MOS transistor (transfer gate) 113, and a NOT circuit (inverter) 111. A control terminal CTL is connected to an input terminal of the NOT circuit 111 and a gate of the N-channel transistor 113. An output terminal of the NOT circuit 111 is connected to a gate of the P-channel transistor 112. Source/drain of the transistors 112 and 113 are connected to the input terminals V5A and V5*b*, respectively.

When a high level voltage is applied to the control terminal CTL, conductive state is established between the sources and drains of the transistors 112 and 113 to establish connection between the input terminals V5A and V5B. On the other hand, when a low level voltage is applied to the control terminal CTL, the sources and drains of the transistors 112 and 113 becomes cut off to disconnect the input terminals V5A and V5B.

It should be noted that the construction of the switch SW is not limited to those employing the combined element of the P-channel and N-channel MOS transistors (transfer gates), but can be constructed with employing only N-channel MOS transistor (transfer gate) or only P-channel MOS transistor (transfer gate).

As discussed in detail, with the eleventh to fifteenth embodiment, by alternately arranging respective gradation wiring of the first gradation level range (e.g. front half gradation level range) and the second gradation level range (e.g. rear half gradation level range), sufficiently large stress voltage can be applied between respective gradation wiring to more certainly detect insulation failure between the gradation wiring. By this, rejection ratio due to deterioration in the market can be reduced to improve reliability. Also, since the stress voltage can be applied between respective gradation wiring by one time of stress voltage application process for successfully detecting the insulation failure between the gradation wiring in a short period to shorten process period and thus to achieve cost down.

Figure 20A:
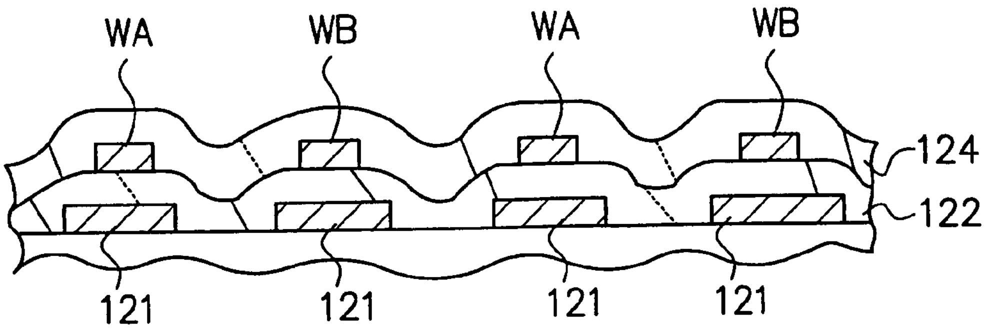
FIGS. 20A to 20C are sections of as semiconductor substrate of a driver for the liquid crystal display.

FIG. 20A is a section of a semiconductor substrate of a driver 102 (FIG. 12) for a liquid crystal display. A first wiring layer 121 is a wiring layer for a decoder 105 (FIG. 12). An insulation layer 122 is formed on the first wiring layer 121. On the insulation layer 122, a second wiring layers WA and WB are formed. The second wiring layer WA is the front half gradation wiring layer, and the second wiring layer WB is the rear half gradation wiring layer. The second gradation wiring layers WA and WB are formed alternately in horizontal direction within the same layer. On the second wiring layers WA and WB, an insulation layer 124 is formed.

Figure 20B:
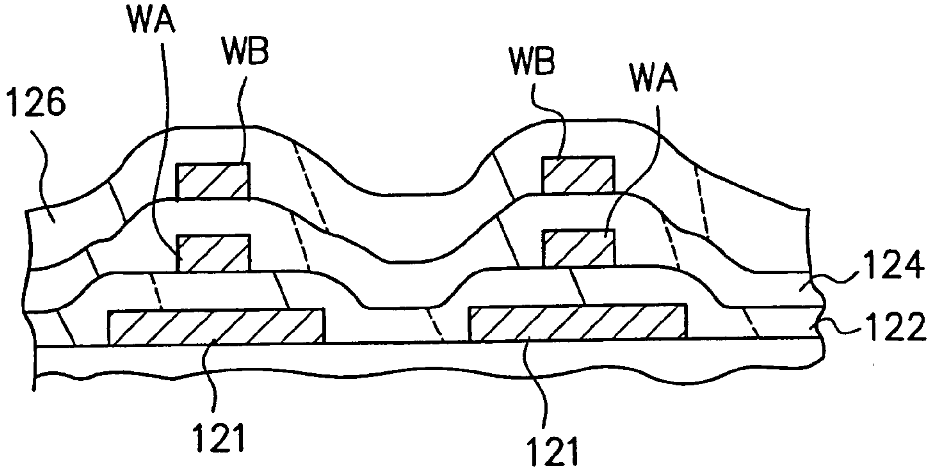

While FIG. 20A illustrates the case where the front half gradation wiring WA and the rear half gradation wiring WB are arranged within the same wiring layer, it is also possible to arrange the front half gradation wiring WA and the rear half gradation wiring WB in mutually different wiring layers as shown in FIG. 20B.

FIG. 20B is a section of another semiconductor substrate of the driver 102 (FIG. 12) for the liquid crystal display. The first wiring layer 121 is the wiring layer of the decoder 105 (FIG. 12). The insulation layer 122 is formed on the first wiring layer 121. On the insulation layer 122, a second wiring layer (front half gradation wiring layer) WA is formed. An insulation layer 124 is formed on the second wiring layer WA. On the insulation layer 124, a third wiring layer (rear half gradation wiring layer) WB is formed. An insulation layer 126 is formed on the third wiring layer WB.

Figure 20C:
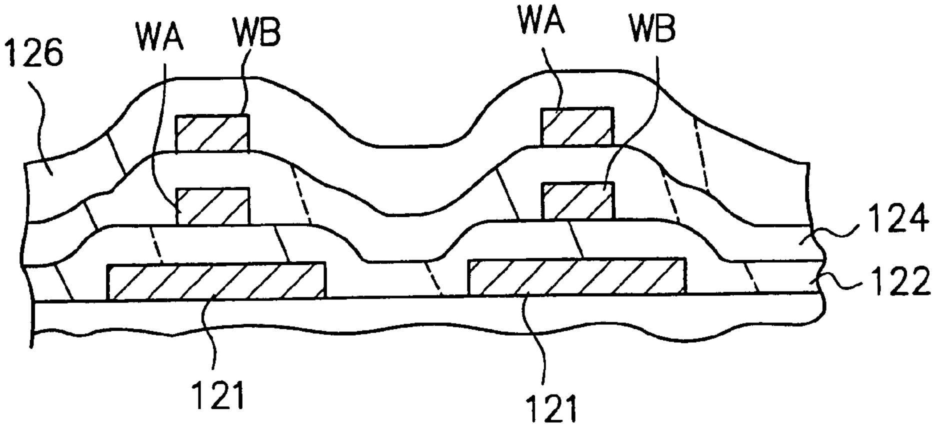

FIG. 20C is a section of a further semiconductor substrate of the driver 102 (FIG. 12) for a liquid crystal display. A first wiring layer 121 is a wiring layer for a decoder 105 (FIG. 12). An insulation layer 122 is formed on the first wiring layer 121. On the insulation layer 122, the second wiring layer WA and the second wiring layer WB are formed alternately in horizontal direction within the same layer. On the second wiring layers WA and WB, an insulation layer 124 is formed. On the insulation layer 124, a third wiring layer WA and a third wiring layer WB are formed alternately in horizontal direction within the same layer. On the third wiring layers WA and WB, an insulation layer 126 is formed. The wiring layers WA and WB in different wiring layers are arranged alternately in vertical direction.

While the foregoing discussion has been given for the case where the gradation wiring is divided into the front half gradation wiring WA and the rear half gradation wiring WB, it is also possible to divide the gradation wiring in three or more fractions. For example, in the gradation voltage generating portion shown in FIG. 22, the gradation wiring is divided into a first region of the gradation wiring W1 to W4, a second region of the gradation wiring W5 to W8, a third region of the gradation wiring W9 to W12 and a fourth region of the gradation wiring W13 to W16. The first and second regions are arranged alternately in comb teeth fashion, and the third and fourth regions are arranged alternately in comb teeth fashion. At this time, it is preferred that two regions arranged alternately are wiring regions of the gradation level range continuing the gradation level mutually. The rear half gradation wiring WB is also divided into four regions similarly to the front half gradation wiring WA to arrange alternately.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A gradation wiring for a display comprising:

wiring for respective gradation levels of a first gradation level range for outputting voltage of said first gradation level range when total number of gradation levels of the display is divided into a plurality of fractions;

wiring for respective gradation level of a second gradation level range different from said first gradation level range, for outputting voltage of said second gradation level range and being arranged alternately with the wiring of respective gradation level of said first gradation level range.

2. A gradation wiring for a display as set forth in claim 1, wherein said second gradation level range is the gradation level range having gradation level in sequence with the gradation level in said first gradation level range.

3. A gradation wiring for a display as set forth in claim 2, wherein the wiring of respective gradation level of said first gradation level range is the wiring of a front half portion of the gradation level range when total number of gradation levels of said display is divided into two, and the wiring of respective gradation level of said second gradation level range is the wiring of a rear half portion of the gradation level range when total number of gradation levels of said display is divided into two.

4. A gradation wiring for a display as set forth in claim 1, wherein the wiring of respective gradation levels of said first and second gradation level ranges are wiring for outputting the gradation voltage to a liquid crystal display.

5. A gradation wiring for a display as set forth in claim 1, which further comprises:

a first ladder resistor connected with the wiring of respective gradation levels of said first gradation level range; and a second ladder resistor connected with the wiring of respective gradation levels of said second gradation level range.

6. A gradation wiring for a display as set forth in claim 5, which further comprises:

a first reference voltage input terminal connected for making voltage of the wiring of respective gradation levels of said first gradation level range at the same potential; and a second reference voltage input terminal connected for making voltage of the wiring of respective gradation levels of said second gradation level range at the same potential.

7. A gradation wiring for a display as set forth in claim 6, wherein a flow direction of the current flowing through said first ladder resistor and a flow direction of the current flowing through said second ladder resistor are the same when a voltage is applied between said first and second reference voltage input terminals.

8. A gradation wiring for a display as set forth in claim 6, wherein a flow direction of the current flowing through said first ladder resistor and a flow direction of the current flowing through said second ladder resistor are mutually opposite direction when a voltage is applied between said first and second reference voltage input terminals.

9. A gradation wiring for a display as set forth in claim 1, which further comprises:

a minimum gradation level reference voltage input terminal connected to a wiring indicative of a minimum gradation level among said wiring;

a maximum gradation level reference voltage input terminal connected to a wiring indicative of a maximum gradation level among said wiring;

two predetermined gradation levels reference voltage input terminals connected to wiring indicative of the same predetermined gradation level.

10. A gradation wiring for a display as set forth in claim 3, which further comprises:

a minimum gradation level reference voltage input terminal connected to a wiring indicative of a minimum gradation level among said wiring;

a maximum gradation level reference voltage input terminal connected to a wiring indicative of a maximum gradation level among said wiring;

two predetermined gradation levels reference voltage input terminals connected to wiring indicative of the same predetermined gradation level.

11. A gradation wiring for a display as set forth in claim 9, which further comprises a switching element for connecting and disconnecting said two predetermined gradation level reference voltage input terminals.

12. A gradation wiring for a display as set forth in claim 11, wherein said switching element is an element of combination of N-channel and P-channel transfer gates.

13. A gradation wiring for a display as set forth in claim 11, wherein said switching element includes only N-channel transfer gate.

14. A gradation wiring for a display as set forth in claim 11, wherein said switching element includes only P-channel transfer gate.

15. A gradation wiring for a display as set forth in claim 1, wherein the wiring of respective gradation level of said first gradation level range and the wiring of respective gradation level of said second gradation level range are arranged in the same layer.

16. A gradation wiring for a display as set forth in claim 1, wherein the wiring of respective gradation level of said first gradation level range and the wiring of respective gradation level of said second gradation level range are arranged in different layers.

17. A driver for a liquid crystal display comprising:

wiring for respective gradation levels of a first gradation level range for outputting voltage of said first gradation level range when total number of gradation levels of the display is divided into a plurality of fractions;

wiring for respective gradation level of a second gradation level range different from said first gradation level range, for outputting analog gradation voltage of respective gradation levels of said second gradation level range and being arranged alternately with the wiring of respective gradation level of said first gradation level range;

a first ladder resistor connected between wiring of respective gradation levels of said first gradation level range;

a second ladder resistor connected between wiring of respective gradation levels of said second gradation level range;

a first reference voltage input terminal connected for making voltages of the wiring of said first gradation level range at the same potential;

a second reference voltage input terminal connected for making voltages of the wiring of said second gradation level range at the same potential; and a decoder for converting input digital gradation value into an analog gradation value on the basis of the analog gradation voltage value output from the wiring of respective gradation levels of said first and second gradation level ranges.

18. A stress test method for a driver of a liquid crystal display having wiring for respective gradation levels of a first gradation level range for outputting voltage of said first gradation level range when total number of gradation levels of the display is divided into a plurality of fractions, and wiring for respective gradation level of a second gradation level range different from said first gradation level range, for outputting voltage of said second gradation level range and being arranged alternately with the wiring of respective gradation level of said first gradation level range, comprising the steps of:

applying a first potential to wiring of a predetermined gradation level of said first gradation level range, applying a second potential to wiring of a predetermined gradation level of said second gradation level range, and whereby applying a stress voltage higher than the reference input voltage between said wiring; and applying said reference input voltages of respective gradation levels to the wiring of predetermined gradation levels of said first and second gradation level ranges and inspecting presence or absence of abnormality of output voltage by measuring voltages output from the wiring of overall gradation levels.

* * * * *